(12) United States Patent
Mitsumoto et al.

(10) Patent No.: US 7,185,424 B2
(45) Date of Patent: Mar. 6, 2007

(54) ELECTRONIC COMPONENT MOUNTING METHOD AND APPARATUS

(75) Inventors: Yutaka Mitsumoto, Neyagawa (JP); Kazuhiro Ikurumi, Katano (JP); Kazumasa Okumura, Kyoto-fu (JP); Mikiya Nakata, Nara (JP); Masaharu Tsujimura, Toyonaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 504 days.

(21) Appl. No.: 10/214,357

(22) Filed: Aug. 8, 2002

(65) Prior Publication Data
US 2003/0133603 A1 Jul. 17, 2003

(30) Foreign Application Priority Data
Aug. 10, 2001 (JP) .............................. 2001-244058

(51) Int. Cl.
*H05K 3/30* (2006.01)
(52) U.S. Cl. .............................. 29/833; 29/832; 29/840
(58) Field of Classification Search .................. 29/832, 29/833, 840
See application file for complete search history.

(56) References Cited

U.S. PATENT DOCUMENTS

| | | | | | |
|---|---|---|---|---|---|
| 2,115,559 | A | * | 4/1938 | Odartchenko | ................ 315/118 |
| 5,864,944 | A | * | 2/1999 | Kashiwagi et al. | ........... 29/833 |
| 6,010,709 | A | * | 1/2000 | Nichols | ...................... 424/401 |
| 6,044,169 | A | * | 3/2000 | Hirotani et al. | ............. 382/145 |
| 6,356,352 | B1 | | 3/2002 | Sumi et al. | |
| 6,446,333 | B1 | * | 9/2002 | Kashiwagi et al. | ........... 29/833 |
| 6,606,790 | B2 | * | 8/2003 | Hidese | ........................ 29/832 |
| 6,718,630 | B2 | * | 4/2004 | Hada et al. | ................... 29/832 |

FOREIGN PATENT DOCUMENTS

| | | |
|---|---|---|
| CN | 1283080 A | 2/2001 |
| JP | 07-307598 | 11/1995 |
| JP | 2863731 | 12/1998 |

* cited by examiner

*Primary Examiner*—Carl J. Arbes
(74) *Attorney, Agent, or Firm*—Wenderoth, Lind & Ponack, L.L.P.

(57) ABSTRACT

All images of a plurality of sucked and held electronic components are picked up, sucked and held states of the electronic components are successively recognized by their respective images in an order of placing the electronic components onto a circuit board, and the electronic components for which such recognition processing is completed can be successively placed onto the circuit board in this order during a process of the recognition processing.

18 Claims, 14 Drawing Sheets

ELECTRONIC COMPONENT MOUNTING METHOD AND APPARATUS

BACKGROUND OF THE PRESENT INVENTION

The present invention relates to a method and apparatus for mounting electronic components onto a circuit board, in particular, a method and apparatus for mounting electronic components with which time required for mounting is reduced when a plurality of electronic components are mounted onto a circuit board.

In recent years, in processes of mounting electronic components, improvement of reliability of work processes and reduction of work processing time are strongly required to improve productivity.

Conventionally, in an electronic component mounting apparatus for mounting electronic components such as chip components or IC chips onto a circuit board, by recognizing states that the electronic components are sucked and held by suction nozzles at a head by images picked up by using an image pickup device such as a CCD camera and collating the states with preset sucked and held states, movement of the head and the suction nozzles is controlled so as to mount electronic components at preset mounting positions on the circuit board, and thus electronic components are mounted on the circuit board.

A method of mounting electronic components onto a circuit board in such an electronic component mounting apparatus is explained below with reference to FIG. 17.

In FIG. 17, reference numeral 202 denotes an electronic component such as a chip component or an IC chip. Reference numeral 201 denotes a suction nozzle for sucking and holding the electronic component 202. This suction nozzle 201 can be moved up and down. Furthermore, this suction nozzle 201 is attached to a head 208, and the head 208 can be moved in an X-axis direction or a Y-axis direction shown in the figure by an XY table 205.

A plurality of electronic components 202 are housed in an electronic component feeding unit 203 and fed. By sucking and holding the electronic components 202 with suction nozzles 201, the electronic components 202 are taken out of the electronic component feeding unit 203. Then, by moving the head 208 by the XY table 205, the suction nozzles 201 are moved to above an image pickup device 204 located at a predetermined position while the electronic components 202 are being sucked and held, and when the electronic components 202 are positioned above the image pickup device 204, the XY table 205 is stopped.

Then, images of states that the electronic components 202 are sucked and held by the suction nozzles 201 are picked up by the image pickup device 204, these picked-up images are outputted to a control unit 206, and positions of the electronic components 202 relative to the suction nozzles 201 are recognized based on the aforementioned images in the control unit 206. Along with this, after image pick-up by the image pickup device 204, by moving the head 208 by the XY table 205, the suction nozzles 201 are moved to above a circuit board 207 fixed on an electronic component placement unit 209 while the electronic components 202 are being sucked and held. Then, relative positional corrections are performed based on results of relative positional recognition of the electronic components 202 relative to the suction nozzles 201 in the control unit 206, and thus the electronic components 202 are placed onto the circuit board 207.

However, in such a method for mounting electronic components, the electronic components 202 are mounted onto the circuit board 207 by repeating an operation where the suction nozzles 201 are moved from the electronic component feeding unit 203 to the image pickup device 204 and stopped above the image pickup device 204 by the XY table 205 for a time sufficient such that image pick-up of the components is performed by the image pickup device 204, an operation where, thereafter, the suction nozzles are moved towards the electronic component placement unit 209 and stopped above the electronic component placement unit 209, and an operation where, after the electronic components 202 are placed, the suction nozzles are moved again towards the electronic component feeding unit 203 and stopped above the electronic component feeding unit 203. Therefore, for example, time for operations that are not directly related to a mounting operation of the electronic components, such as a time for which the suction nozzles are stopped for image pick-up by the image pickup device 204, is extremely long, and there is an issue in that reduction of mounting time cannot be sufficiently addressed.

In order to solve such an issue, an electronic component mounting method has been proposed wherein static images of the electronic components 202 are picked up by providing the image pickup device 204 with an electronic shutter function, and using the electronic shutter function when the electronic components 202 pass above the image pickup device 204 by operation of the XY table 205 without stopping the suction nozzles 201.

Since deceleration time for stopping the suction nozzles 201 above the image pickup device 204 by operation of the XY table 205, time for image pickup by the image pickup device 204, and acceleration time for moving the suction nozzles to the electronic component mounting unit 209, can be reduced by such an electronic component mounting method, whereby reduction of mounting time can be addressed.

However, even in such an electronic component mounting method, an operation where the suction nozzles 201 are moved to above the image pickup device 204, which is an image pickup position, is required. Furthermore, due to a size of the mounting apparatus, a limitation in arrangement of component units on the mounting apparatus, and the like, it is difficult to dispose the image pickup device 204 on a line connecting the electronic component feeding unit 203 and the electronic component placement unit 209. Therefore, there is an issue that further reduction of mounting time cannot be realized.

In order to solve such an issue, there is an electronic component mounting method wherein an XY table includes both a head equipped with suction nozzles and an image pickup device, whereby the image pickup device is similarly moved with the suction nozzles while the suction nozzles on the head are being moved, and images of electronic components are picked up by the image pickup device during this movement of the suction nozzles and the image pickup device, so that time for moving the electronic components 202 to above image pickup device 204 is reduced. An example thereof is the electronic component mounting method described in Japanese Patent No. 2863731.

In order to further reduce the time for mounting electronic components by such an electronic component mounting method, the number of times the suction nozzles travel between the electronic component feeding unit and the electronic component placement unit needs to be reduced by increasing the number of suction nozzles of the head. Furthermore, time required for mounting electronic components also needs to be reduced by increasing a travel speed of the suction nozzles and shortening a travel distance of the suction nozzles.

However, when the number of suction nozzles of the head is increased, time required for picking up images of states that electronic components are sucked and held by the suction nozzles in the image pickup device, and time for recognizing these images, are increased in proportion to the number of suction nozzles. In addition, when a travel distance of the suction nozzles is reduced with an increase in the number of suction nozzles, a phenomenon occurs that travel time of the suction nozzles is shorter than time for which images are picked up, recognized and processed by the image pickup device. In such a case, since the electronic components cannot be placed onto the circuit board until pickup and recognition of images of the electronic components by the image pickup device are completed, there is an issue in that a loss occurs in time for mounting electronic components.

As practical electronic component mounting apparatuses, many apparatuses with about ten suction nozzles have been developed. When images of electronic components sucked and held by these suction nozzles are successively picked up, a time of 33 msec×10=330 msec is required as time required for image pickup when an image pickup device is a usual interlace type camera. Furthermore, even when a camera that outputs an image by a dual system is used as the image pickup device, a time of 16.5 msec×10 nozzles=165 msec is required as time required for image pickup. Furthermore, time of 100 msec is required for recognition processing of picked-up images. That is, at least a time of 265 msec is required to complete pickup and recognition of images of electronic components. On the other hand, a travel time of the suction nozzles is reduced to 200 msec. There is an issue in that reduction of the time for mounting electronic components cannot be expected even when the travel time of the suction nozzles is further reduced.

Accordingly, an object of the present invention is to provide an electronic component mounting method and apparatus by which time required for mounting electronic components is efficiently reduced, and hence productivity can be improved since, for a plurality of electronic components sucked and held by a plurality of sucking and holding members, images of states that the electronic components exhibit when sucked and held are picked up by an image pickup device and successively recognized, electronic components for which image recognition processing is completed are successively placed so that a placing operation of electronic components can be performed at the same time as work of image recognition processing even when recognition processing of images of the sucked and held states of all the electronic components is not completed, and thus solve the aforementioned issues.

SUMMARY OF THE PRESENT INVENTION

In order to achieve the above object, the present invention is constituted as follows.

In a first aspect of the present invention, there is provided an electronic component mounting method comprising:

picking up images of all of a plurality of sucked and held electronic components;

successively recognizing sucked and held states of the electronic components by their respective images in an order of placing the electronic components onto a circuit board; and during a process of recognition processing in the aforementioned order, successively setting the electronic components, for which the recognition processing is completed, as placeable onto the circuit board in the aforementioned order.

In a second aspect of the present invention, there is provided an electronic component mounting method comprising:

simultaneously picking up images of all of a plurality of sucked and held electronic components;

successively recognizing sucked and held states of the electronic components by their respective images in an order of placing the electronic components onto a circuit board; and during a process of recognition processing in the aforementioned order, successively setting the electronic components, for which the recognition processing is completed, as placeable onto the circuit board in the aforementioned order.

In a third aspect of the present invention, there is provided an electronic component mounting method, in a case where a plurality of sucked and held electronic components include two kinds of electronic components, that is, first electronic components and second electronic components, the method comprising:

picking up images of either one of the first electronic components and the second electronic components, and thereafter picking up images of the other;

successively recognizing sucked and held states of the electronic components by their respective images in an order of placing the electronic components onto a circuit board; and during a process of recognition processing in the aforementioned order, successively setting the electronic components, for which the recognition processing is completed, as placeable onto the circuit board in the aforementioned order.

In a fourth aspect of the present invention, there is provided an electronic component mounting method as described in the third aspect, wherein images of at least either one of the first electronic components and the second electronic components are simultaneously picked up.

In a fifth aspect of the present invention, there is provided an electronic component mounting method as described in any one of the first to fourth aspects, further comprising: during a process of the recognition processing in the aforementioned order, after successively setting the electronic components, for which the recognition processing is completed, as placeable onto the circuit board in the aforementioned order, successively starting placement of the electronic components, which have been successively set as placeable in the aforementioned order, onto the circuit board in the aforementioned order based on results of the recognition processing.

In a sixth aspect of the present invention, there is provided an electronic component mounting method as described in any one of the first to fifth aspects, wherein, during a process of moving the sucked and held electronic components for their placement onto the circuit board, all the images of the plurality of sucked and held electronic components are picked up by an image pickup device.

In a seventh aspect of the present invention, there is provided an electronic component mounting method as described in any one of the first to fifth aspects, further comprising:

during a process of moving the sucked and held electronic components for their placement onto the circuit board, routing the electronic components via a position at which all the images of the electronic components can be picked up by an image pickup device; and upon a passage through the position, picking up all the images of the sucked and held electronic components by the image pickup device.

In an eighth aspect of the present invention, there is provided an electronic component mounting apparatus for mounting a plurality of electronic components fed from an electronic component feeding unit onto a circuit board, which comprises:

a component holding unit having a plurality of sucking and holding members that can suck and hold a plurality of electronic components;

an image pickup device that can pick up images of the electronic components sucked and held by the plurality of the sucking and holding members, and that is attached to the component holding unit;

a moving device for moving the component holding unit between the electronic component feeding unit and the circuit board; and a control unit for controlling operations of the sucking and holding members, the image pickup device and the moving device, wherein during a process of moving the component holding unit from the electronic component feeding unit to the circuit board, the control unit causes images of the electronic components sucked and held by the plurality of sucking and holding members to be picked up by the image pickup device, thereafter successively recognizes sucked and held states of the electronic components by their respective images in an order of placing the electronic components onto the circuit board, and during a process of recognition processing, successively sets the electronic components, for which the recognition processing is completed, as placeable onto the circuit board.

In a ninth aspect of the present invention, there is provided an electronic component mounting apparatus for mounting a plurality of electronic components fed from an electronic component feeding unit onto a circuit board in an electronic component placement unit, which comprises:

a component holding unit having a plurality of sucking and holding members that can suck and hold a plurality of electronic components;

an image pickup device that can pick up images of the electronic components sucked and held by the plurality of the sucking and holding members of the component holding unit, and that is attached to the component holding unit;

a moving device for moving the component holding unit between the electronic component feeding unit and the electronic component placement unit; and a control unit for controlling operations of the component holding unit, the sucking and holding members, the image pickup device and the moving device, wherein the control unit, under its control of the moving device, during a process of moving the component holding unit from the electronic component feeding unit to the electronic component placement unit by the moving device, makes the component holding unit pass through a position at which images of the electronic components can be picked up by the image pickup device, and under the control unit's control of the image pickup device, causes the image pickup device to pick up images of the electronic components sucked and held by the plurality of sucking and holding members, and thereafter causes individual images to be successively outputted to the control unit in an order of placing the electronic components onto the circuit board in the electronic component placement unit, and wherein in the control unit, states of the electronic components when sucked and held by the plurality of sucking and holding members are successively recognized by their respective images in the aforementioned order, and during a process of recognition processing in the aforementioned order, the electronic components for which the recognition processing is completed are successively set as placeable onto the circuit board, in the aforementioned order, in the electronic component placement unit.

In a tenth aspect of the present invention, there is provided an electronic component mounting apparatus for mounting a plurality of electronic components fed from an electronic component feeding unit onto a circuit board, which comprises:

a component holding unit having a plurality of sucking and holding members that can suck and hold a plurality of electronic components;

an image pickup device that can pick up images of the electronic components sucked and held by the plurality of the sucking and holding members, and that is attached to a machine base of the electronic component mounting apparatus;

a moving device for moving the component holding unit between the electronic component feeding unit and the circuit board; and a control unit for controlling operations of the sucking and holding members, the image pickup device and the moving device, wherein the control unit, during a process of moving the component holding unit from the electronic component feeding unit to the circuit board, makes the component holding unit pass through a position at which images of the electronic components can be picked up by the image pickup device, causes the image pickup device to pick up all the images of the electronic components sucked and held by the plurality of sucking and holding members upon a passage through the position, thereafter successively recognizes sucked and held states of the electronic components by their respective images in an order of placing the electronic components onto the circuit board, and during a process of this recognition processing, successively sets the electronic components, for which the recognition processing is completed, as placeable onto the circuit board.

In an eleventh aspect of the present invention, there is provided an electronic component mounting apparatus for mounting a plurality of electronic components fed from an electronic component feeding unit onto a circuit board in an electronic component placement unit, which comprises:

a component holding unit having a plurality of sucking and holding members that can suck and hold a plurality of electronic components;

an image pickup device that can pick up images of the electronic components sucked and held by the plurality of the sucking and holding members of the component holding unit, and that is attached to a machine base of the electronic component mounting apparatus;

a moving device for moving the component holding unit between the electronic component feeding unit and the electronic component placement unit; and a control unit for controlling operations of the component holding unit, the sucking and holding members, the image pickup device and the moving device, wherein the control unit controls the moving device, and during a process of moving the component holding unit from the electronic component feeding unit to the electronic component placement unit by the moving device, makes the component holding unit pass through a position at which images of the electronic components can be picked up by the image pickup device, and under control of the image pickup device, causes the image pickup device to pick up all the images of the electronic components sucked and held by the plurality of sucking and holding members upon a passage through the position, and thereafter causes individual images to be successively outputted to the control unit in an order of placing the electronic components onto the circuit board in the electronic component placement unit, and wherein in the control unit, states of the electronic components sucked and held by the plurality of sucking and holding members are successively recognized by their respective images in the aforementioned order, and during a process of this recognition processing in the aforementioned order the electronic components, for which the recognition processing is completed, are successively set as placeable onto the circuit board, in the aforementioned order, in the electronic component placement unit.

In a twelfth aspect of the present invention, there is provided an electronic component mounting apparatus for mounting a plurality of electronic components fed from an electronic component feeding unit onto a circuit board, which comprises:

a component holding unit having a plurality of sucking and holding members that can suck and hold a plurality of electronic components;

an image pickup device that includes a same number of image pickup elements as that of the sucking and holding members of the component holding unit, that can pick up images of the electronic components, sucked and held by the plurality of the sucking and holding members, by the image pickup elements, and that is attached to the component holding unit;

a moving device for moving the component holding unit between the electronic component feeding unit and the electronic component placement unit; and a control unit for controlling operations of the sucking and holding members, the image pickup device and the moving device, wherein during a process of moving the component holding unit from the electronic component feeding unit to the circuit board, the control unit causes the image pickup elements to simultaneously pick up all the images of the electronic components sucked and held by the plurality of sucking and holding members, thereafter successively recognizes sucked and held states of the electronic components by their respective images in an order of placing the electronic components onto the circuit board, and during a process of this recognition processing successively sets the electronic components, for which the recognition processing is completed, as placeable onto the circuit board.

In a thirteenth aspect of the present invention, there is provided an electronic component mounting apparatus for mounting a plurality of electronic components fed from an electronic component feeding unit onto a circuit board by an electronic component placement unit, which comprises:

a component holding unit having a plurality of sucking and holding members that can suck and hold a plurality of electronic components;

an image pickup device that includes a same number of image pickup elements as that of the sucking and holding members of the component holding unit, that can pick up images of the electronic components, sucked and held by the plurality of the sucking and holding members, by the image pickup elements, and that is attached to the component holding unit;

a moving device for moving the component holding unit between the electronic component feeding unit and the electronic component placement unit; and a control unit for controlling operations of the sucking and holding members, the image pickup device and the moving device, wherein the control unit controls the moving device, and during a process of moving the component holding unit from the electronic component feeding unit to the electronic component placement unit by the moving device, controls the image pickup device such that the image pickup elements simultaneously pick up all the images of the electronic components sucked and held by the plurality of sucking and holding members, and thereafter causes individual images to be successively outputted to the control unit in an order of placing the electronic components onto the circuit board in the electronic component placement unit, and wherein in the control unit, states of the electronic components sucked and held by the plurality of sucking and holding members are successively recognized by their respective images in the aforementioned order, and during a process of this recognition processing in the aforementioned order the electronic components, for which the recognition processing is completed, are successively set as placeable onto the circuit board, in the aforementioned order, in the electronic component placement unit.

In a fourteenth aspect of the present invention, there is provided an electronic component mounting apparatus for mounting a plurality of electronic components fed from an electronic component feeding unit onto a circuit board, which comprises:

a component holding unit having a plurality of sucking and holding members that can suck and hold a plurality of electronic components;

an image pickup device that includes a same number of image pickup elements as that of the sucking and holding members, that can pick up images of the electronic components, sucked and held by the plurality of the sucking and holding members, by the image pickup elements, and that is attached to a machine base of the electronic component mounting apparatus;

a moving device for moving the component holding unit between the electronic component feeding unit and the circuit board; and a control unit for controlling operations of the sucking and holding members, the image pickup device and the moving device, wherein the control unit, during a process of moving the component holding unit from the electronic component feeding unit to the circuit board, makes the component holding unit pass through a position at which images of the electronic components can be picked up by the image pickup device, and upon a passage through the position, causes the image pickup elements to simultaneously pick up all the images of the electronic components sucked and held by the plurality of sucking and holding members, thereafter successively recognizes sucked and held states of the electronic components by their respective images in an order of placing the electronic components onto the circuit board, and during a process of this recognition processing successively sets the electronic components, for which the recognition processing is completed, as placeable onto the circuit board.

In a fifteenth aspect of the present invention, there is provided an electronic component mounting apparatus for mounting a plurality of electronic components fed from an electronic component feeding unit onto a circuit board in an electronic component placement unit, which comprises:

a component holding unit having a plurality of sucking and holding members that can suck and hold a plurality of electronic components;

an image pickup device that includes a same number of image pickup elements as that of the sucking and holding members of the component holding unit, that can pick up images of the electronic components, sucked and held by the plurality of the sucking and holding members, by the image pickup elements, and that is attached to a machine base of the electronic component mounting apparatus;

a moving device for moving the component holding unit between the electronic component feeding unit and the electronic component placement unit; and a control unit for controlling operations of the component holding unit, the sucking and holding members, the image pickup device and the moving device, wherein the control unit, under its control of the moving device, during a process of moving the component holding unit from the electronic component feeding unit to the electronic component placement unit by the moving device, makes the component holding unit pass through a position at which images of the electronic components can be picked up by the image pickup device, and under the control unit's control of the image pickup device, causes all the images of the electronic components sucked and held by the plurality of sucking and holding members to be simultaneously picked up by the image pickup elements in the image pickup device upon a passage through the position, and thereafter causes individual images to be successively outputted to the control unit in an order of placing the electronic components onto the circuit board in the electronic component placement unit, and wherein in the control unit, states of the electronic components sucked and held by the plurality of sucking and holding members are successively recognized by their respective images in the aforementioned order, and during a process of this recognition processing in the aforementioned order the electronic components, for which the recognition processing is completed, are successively set as placeable onto the circuit board, in the aforementioned order, in the electronic component placement unit.

In a sixteenth aspect of the present invention, there is provided an electronic component mounting apparatus as described in any one of the eighth to fifteenth aspects, wherein the sucking and holding members are provided so as to be replaceable with different kinds of sucking and holding members in the component holding unit; and the image pickup device is equipped with a lens for forming an image of an electronic component and allowing an image pickup element to pick up the image, with the lens being provided so as to be replaceable with a different kind of lens.

In a seventeenth aspect of the present invention, there is provided an electronic component mounting apparatus for mounting a plurality of electronic components fed from an electronic component feeding unit onto a circuit board, in a case where the electronic components include two kinds of electronic components, that is, first electronic components and second electronic components, the electronic component mounting apparatus comprising:

a component holding unit having a plurality of sucking and holding members that can suck and hold the first electronic components or the second electronic components;

an image pickup device which is equipped with lenses for forming images of the first electronic components sucked and held by a plurality of the sucking and holding members so as to allow pickup of the images, and lenses for forming images of the second electronic components sucked and held by a plurality of the sucking and holding members so as to allow pickup of these images, and which is attached to a machine base of the electronic component mounting apparatus;

a moving device for moving the component holding unit between the electronic component feeding unit and the circuit board; and a control unit for controlling operations of the sucking and holding members, the image pickup device and the moving device, wherein the control unit, during a process of moving the component holding unit from the electronic component feeding unit to the circuit board, makes the component holding unit pass through positions at which images of the first electronic components and second electronic components can be picked up, respectively, by the image pickup device, and causes all the images of the first electronic components and the second electronic components sucked and held by the plurality of sucking and holding members to be picked up by the image pickup device upon a passage through respective positions, thereafter successively recognizes sucked and held states of the electronic components by their respective images in an order of placing the electronic components onto the circuit board, and during a process of this recognition processing successively sets the electronic components, for which the recognition processing is completed, as placeable onto the circuit board.

In an eighteenth aspect of the present invention, there is provided an electronic component mounting apparatus for mounting a plurality of electronic components fed from an electronic component feeding unit onto a circuit board in an electronic component placement unit, in a case where the electronic components include two kinds of electronic components, that is, first electronic components and second electronic components, the electronic component mounting apparatus comprising:

a component holding unit having a plurality of sucking and holding members that can suck and hold the first electronic components or the second electronic components;

an image pickup device which is equipped with lenses for forming images of the first electronic components sucked and held by a plurality of the sucking and holding members of the component holding unit so as to allow pickup of the images, and lenses for forming images of the second electronic components sucked and held by a plurality of the sucking and holding members of the component holding unit so as to allow pickup of these images, and which is attached to a machine base of the electronic component mounting apparatus;

a moving device for moving the component holding unit between the electronic component feeding unit and the electronic component placement unit; and a control unit for controlling operations of the component holding unit, the sucking and holding members, the image pickup device and the moving device, wherein the control unit, under its control of the moving device, during a process of moving the component holding unit from the electronic component feeding unit to the electronic component placement unit by the moving device, makes the component holding unit pass through positions at which images of the first electronic components and second electronic components can be picked up, respectively, by the image pickup device, and under the control unit's control of the image pickup device, causes all the images of the first electronic components and the second electronic components sucked and held by the plurality of sucking and holding members to be picked up by the image pickup device upon a passage through the positions, and thereafter causes individual images to be successively outputted to the control unit in an order of placing the electronic components onto the circuit board in the electronic component placement unit, and wherein in the control unit, states of the electronic components sucked and held by the plurality of sucking and holding members are successively recognized by their respective images in the aforementioned order, and during a process of this recognition processing in the aforementioned order the electronic components, for which the recognition processing is completed, are successively set as placeable onto the circuit board, in the aforementioned order, in the electronic component placement unit.

In a nineteenth aspect of the present invention, there is provided an electronic component mounting apparatus as described in the seventeenth or eighteenth aspect, wherein the image pickup device is equipped with a same number of at least either one of the lenses for forming the images of the first electronic components so as to allow pickup of these images, and the lenses for forming the images of the second electronic components so as to allow pickup of these images, with the number being same as that of the sucking and holding members, and pickup of the images of at least either one of the first electronic components and the second electronic components by the image pickup device is fulfilled by an image being formed by a lens or the images being simultaneously formed by the lenses.

In a twentieth aspect of the present invention, there is provided an electronic component mounting apparatus as described in any one of the eighth to nineteenth aspects, wherein the control unit, during a process of the recognition processing in the aforementioned order, successively sets the electronic components, for which the recognition processing is completed, as placeable onto the circuit board in the aforementioned order, and upon arrival of the component holding unit at the electronic component placement unit, successively starts placement of the electronic components, which have been successively set as placeable in the aforementioned order, onto the circuit board in the aforementioned order based on results of the recognition processing.

In a twenty-first aspect of the present invention, there is provided an electronic component mounting apparatus as described in any one of the fourteenth to sixteenth aspects, wherein the sucking and holding members in the component holding unit are arranged in a matrix with a plurality of rows and a plurality of columns, and the image pickup elements are arranged so as to correspond to the sucking and holding devices one to one in the image pickup device.

BRIEF DESCRIPTION OF THE DRAWINGS

These and other aspects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1:
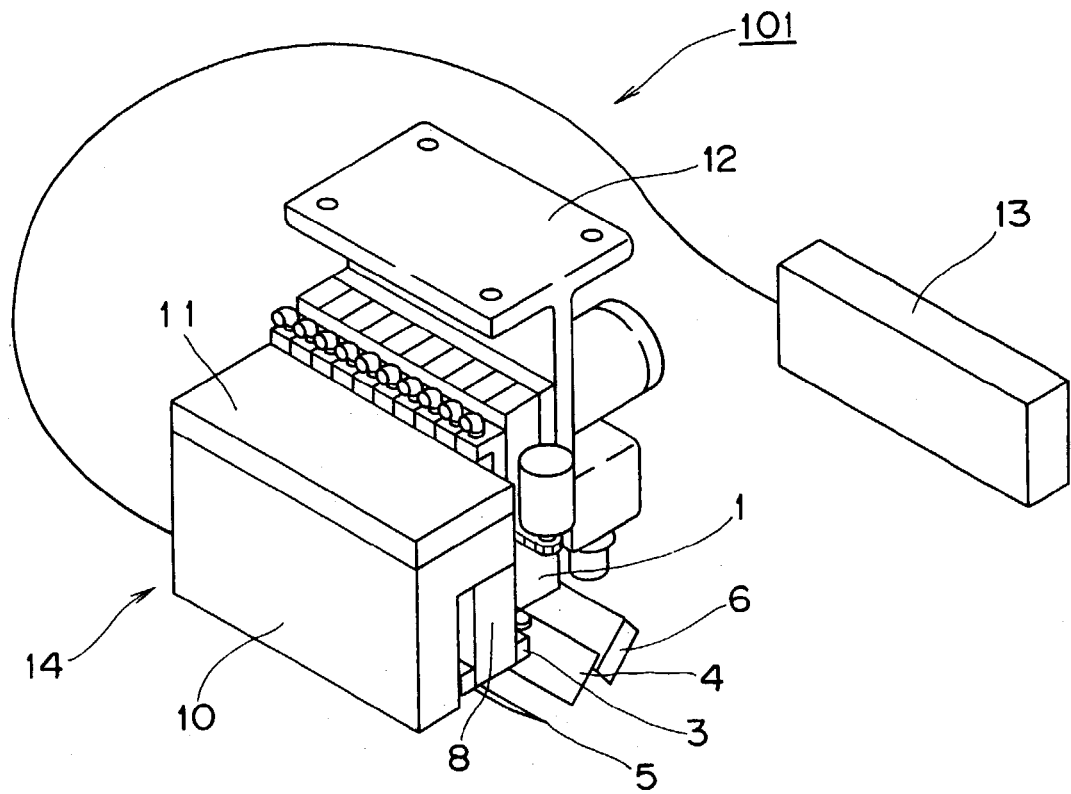
FIG. 1 is a perspective view showing a head unit according to a first embodiment of the present invention.

Before description of the present invention proceeds, it is to be noted that like parts are designated by like reference numerals throughout the accompanying drawings.

Embodiments of the present invention are described in detail with reference to the accompanying drawings.

Figure 2:
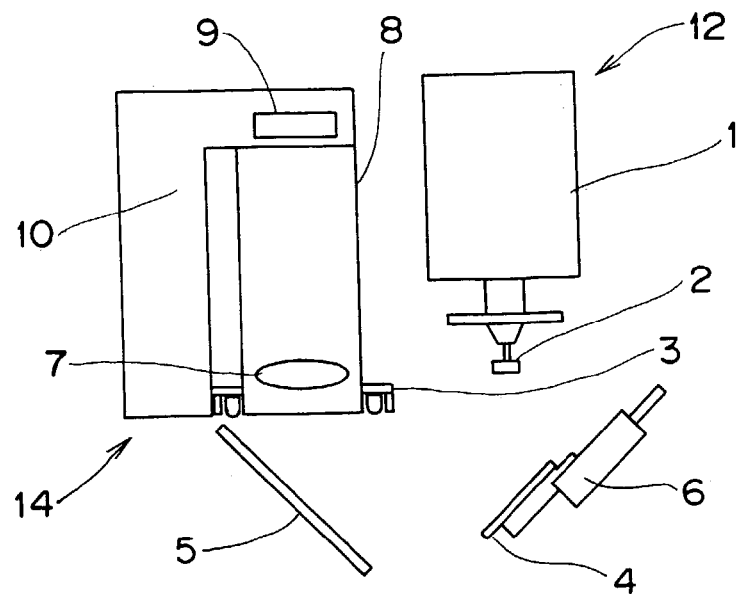
FIG. 2 is a schematic constituent view showing a first head unit.

FIG. 1 is a perspective view showing a head unit 101 as one example of a component holding unit in an electronic component mounting apparatus according to a first embodiment of the present invention. FIG. 2 is a schematic constituent view schematically showing a configuration of this head unit 101.

As shown in FIGS. 1 and 2, the head unit 101 is constituted by a head 12 for handling electronic components and an image pickup device 14 for picking up images of the electronic components.

The head 12 is equipped with ten suction nozzles 1 as one example of sucking and holding members, and the suction nozzles 1 are arranged adjacent each other in a line in a frame of the head 12 made of a rigid body. Electronic components 2 such as chip components or IC chips are sucked and held at end portions of the suction nozzles 1. Furthermore, the suction nozzles 1 can be moved up and down. The suction nozzles are moved in a downward direction when sucking and holding the electronic components 2 or placing the electronic components 2 onto a circuit board, and moved in an upward direction when the head 12 is moved so as not to interfere with a circuit board and other members constituting the electronic component mounting apparatus.

The image pickup device 14 is equipped with lenses 7 each for forming an image of electronic component 2, and CCDs 9 as one example of the image pickup devices for picking up images formed by the lenses 7. Ten lenses and CCDs, which is the same number as that of the suction nozzles 1, are arranged adjacent each other in a line. The lenses 7 and the CCDs 9 correspond to respective suction nozzles 1 one to one. Furthermore, the lenses 7 are held in a lower portion inside a square-cylindrical lens barrel 8, and a corresponding CCD 9 is installed in a connecting portion with an upper portion of the lens barrel 8 in a camera unit 10 provided and fixed so as to cover an upper portion and one side portion of the lens barrel 8. The lens barrel 8 is fixed in the frame of the head 12.

The camera unit 10 performs image signal processing of image pickup data signals, which are signals including image pickup data outputted from the CCDs 9, and output of drive signals for outputting image pickup timing signals and image pickup data signals to respective CCDs 9, and is further provided with an electronic shutter function, which can control image pickup time in each CCD 9.

Furthermore, a plurality of illumination units 3 are placed on both sides along a direction of arrangement of the lenses 7 along an outer periphery of a lower portion of the lens barrel 8 so that light can be emitted in the downward direction, and an illumination control unit 11 for individually controlling intensity of illumination, and turning on/off, of these illumination units 3 is fixed on top of the camera unit 10.

Furthermore, a stationary fixed mirror 5 is fixed below the lens barrel 8 with its reflecting surface facing upward and an end portion on the suction nozzle 1 side inclined downward. Furthermore, below the suction nozzles 1, a mobile-type movable mirror 4 is attached to a mirror drive unit 6 for moving the movable mirror 4 with its reflecting surface facing upward and an end portion on the fixed mirror 5 side inclined downward. This mirror drive unit 6 is fixed in the frame of the head 12, and can move the movable mirror 4 along the reflecting surface.

Here, an arrangement of component members of the head unit 101 is explained along a light path illuminated by the illumination unit 3. In the image pickup device 14, centers of one CCD 9 and a corresponding lens 7 are positioned coaxially, and this axis becomes an optical axis. Light emitted from the illumination unit 3 in parallel along this optical axis is reflected from the fixed mirror 5 in a lateral direction, this reflected light is reflected upward on the movable mirror 4, and an electronic component 2 sucked and held by the suction nozzle 1 corresponding to the CCD 9 and the lens 7 is illuminated from a downward position. Consequently, an image of the electronic component 2 is reflected from the movable mirror 4 in the lateral direction, this reflected light is reflected upward onto the fixed mirror 5 in parallel along the optical axis, and then the image is formed by the lens 7 and picked up by the CCD 9.

Furthermore, the head 12 and the image pickup device 14 constituted by the aforementioned component members can be moved as the head unit 101. Furthermore, operation of the head unit 101 in its entirety is controlled by a control unit 13, and recognition processing of an image signal outputted by the camera unit 10, and output of a command of turning on/off the illumination unit 3 to the illumination control unit 11, are performed in the control unit 13.

Furthermore, since, in the image pickup device 14, the camera unit 10 can perform output of an image pickup timing signal to each CCD 9, image signal processing of an image pickup data signal outputted from each CCD 9, and output of the image signal to the control unit 13, the image pickup device 14 allows the CCD 9 to simultaneously pick up images formed by the lenses 7 with these functions and allows the CCD 9 which picks up the images to successively output image pickup data signals. In the camera unit 10, image signal processing of image pickup data signals is successively performed and these image signals are successively outputted to the control unit 13, so that a function of simultaneous image pickup and successive image output can be realized.

Furthermore, the image pickup of each electronic component 2 by each CCD 9 in the image pickup device 14 is performed between a time when a suction nozzle 1 in the head 12 sucks and holds the electronic component 2 and a time when the head 12 completes its movement and places the electronic component 2 onto the circuit board.

Figure 4:
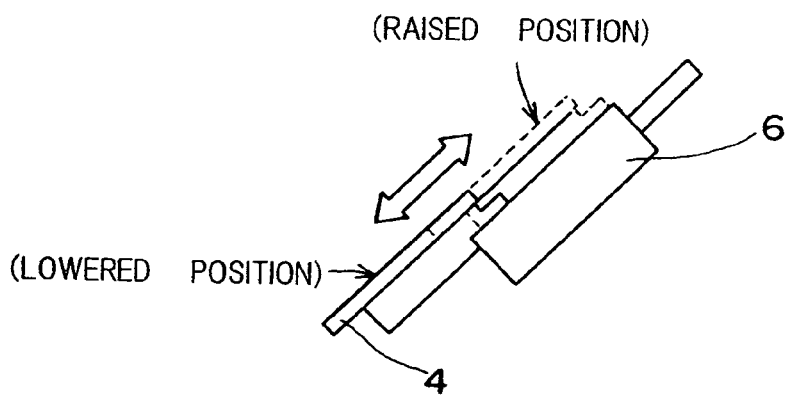
FIG. 4 is a view showing an operation of a movable mirror in the head unit according to the first embodiment.
Figure 17:
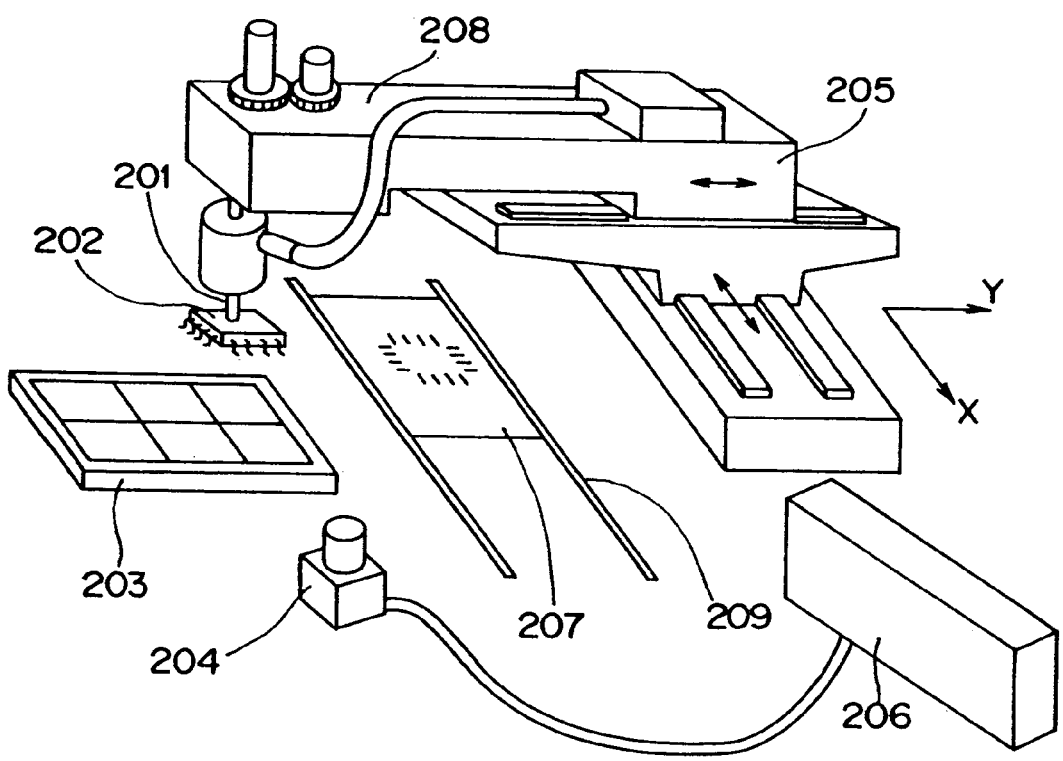
FIG. 17 is a schematic perspective view showing a conventional electronic component mounting apparatus.

A drive operation of the movable mirror 4 by the mirror drive unit 6 is explained below with reference to FIG. 4. As shown in FIG. 4, the movable mirror 4 is driven in a direction in parallel to the reflecting surface of the movable mirror 4 by a motor, a pneumatic cylinder, or the like of the mirror drive unit 6. Therefore, when the suction nozzle 1 sucks and holds an electronic component 2 and when the electronic component 2 is placed onto the circuit board, the movable mirror 4 can be moved to a withdrawal position, at which vertical movement of the suction nozzle 1 is not interfered with, that is a raised position in FIG. 4. When an image of the electronic component 2 is picked up, the movable mirror 4 can be moved to a reflection position, at which the image of the electronic component 2 can be reflected, that is, a lowered position in FIG. 4.

Figure 5:
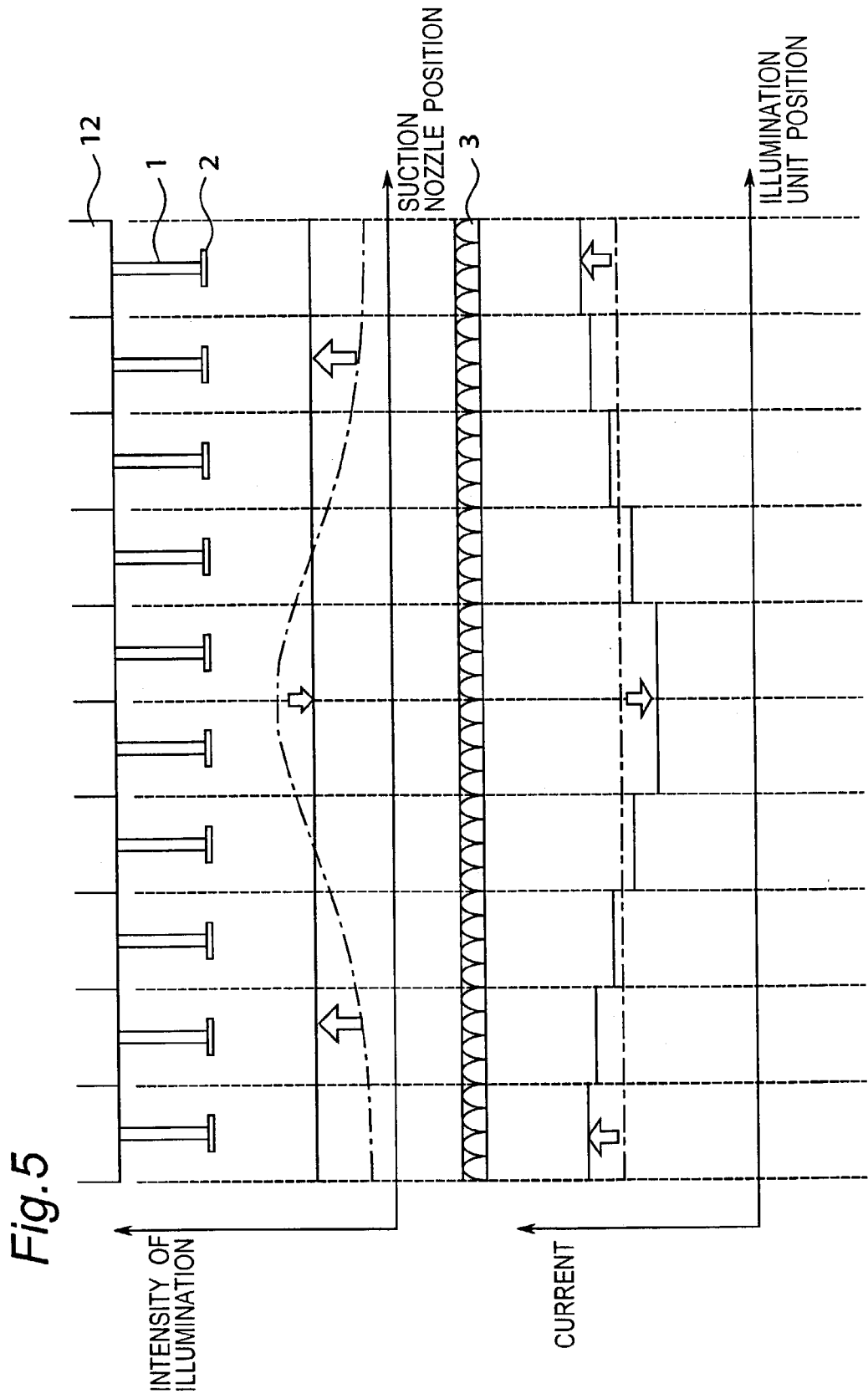
FIG. 5 is an explanatory view showing a relationship between intensity of illumination and current in an illumination unit according to the first embodiment.

An individual control of intensity of illumination of each illumination unit 3 by the illumination control unit 11 is explained below. FIG. 5 is an explanatory view showing a relationship between intensity of light, emitted by each illumination unit 3 to illuminate a lower surface of each electronic component 2 sucked and held by the suction nozzle 1, and a current in the illumination unit 3.

As shown in FIG. 5, when each illumination unit 3 is turned on by a certain current, intensity of illumination on a surface of each electronic component 2 is higher in the vicinity of a center of each arranged suction nozzle and lower at its end portion. Therefore, by controlling the current for turning on each illumination unit in the illumination control unit 11, so that the current of the illumination unit corresponding to the vicinity of the center is reduced and the current of the illumination unit 3 corresponding to the end portion is increased, intensity of illumination on the surface of each electronic component 2 is made generally constant. Consequently, an image of the electronic component 2 picked up by each CCD can be made more uniform and an image pickup state can be stabilized.

Furthermore, each illumination unit 3 can be individually replaced. By replacing a part or an entirety of each illumination unit 3, an illumination color, illumination angle, intensity of illumination and the like can be changed.

Figure 3:
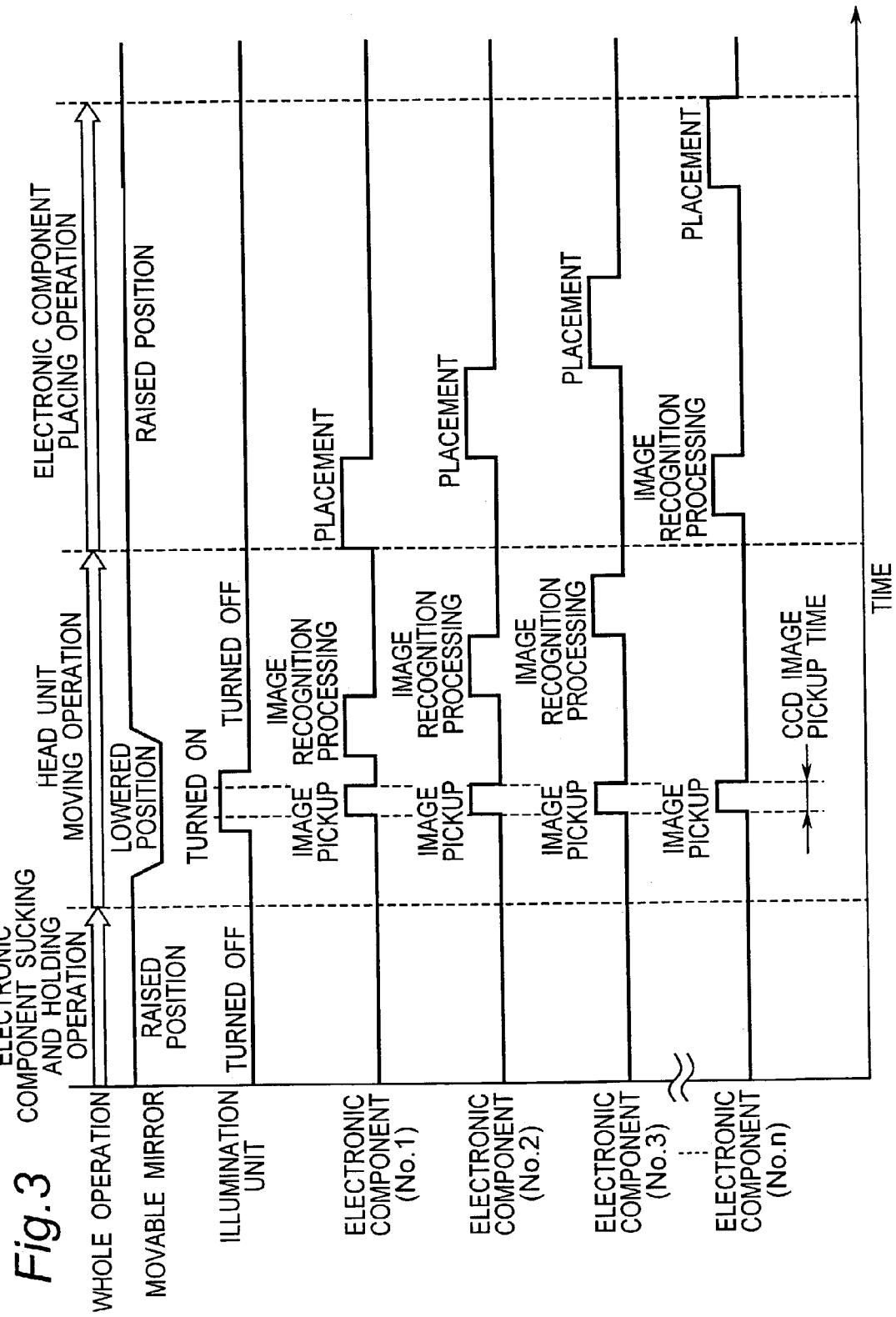
FIG. 3 is an operation timing chart of respective operations in the head unit according to the first embodiment.

FIG. 3 is an operation timing chart about respective operations of the head unit 101 in the electronic component mounting apparatus having the above constitution.

As shown in FIG. 3, when the suction nozzle 1 is performing an electronic component sucking operation for sucking and holding an electronic component 2, the movable mirror 4 is at the raised position by operation of the mirror drive unit 6 shown in FIG. 4, and hence the sucking operation of the suction nozzle 1 is not interfered with. After the suction nozzle 1 sucks and holds the electronic component 2, the head 12 of the head unit 101 starts a moving operation. After the head 12 starts the moving operation, the movable mirror 4 is moved to the lowered position shown in FIG. 4 by operation of the mirror drive unit 6.

After the movable mirror 4 is moved to the lowered position, the illumination unit 3 is turned on, an image of an electronic component 2 sucked and held by the suction nozzle 1 is formed by the lens 7 via the movable mirror 4 and the fixed mirror 5 in the image pickup device 14 by indirect light illumination of the illumination unit 3 via the fixed mirror 5 and the movable mirror 4, and simultaneously picked up by the CCD 9.

After this image pickup by the CCD 9 is completed, light of the illumination unit 3 is turned off, and the movable mirror 4 is moved to the raised position. Along with this, an image pickup data signal outputted from each CCD 9 is processed in the camera unit 10 and outputted as an image signal to the control unit 13. At this time, since the image pickup data signals outputted from the CCD 9 are not overlapped but successively outputted, these signals are also successively processed in the camera unit 10 and successively outputted as image signals to the control unit 13. Therefore, it is sufficient that a recognition processing unit in the control unit 13 for receiving the image signals and performing recognition processing includes only one system as an I/F for each image signal or a processing system, and hence a scale of the recognition processing unit is small. Thus, costs of the electronic component mounting apparatus can be reduced.

Furthermore, here, when an order of placing the electronic components 2 sucked and held by the suction nozzles 1 onto the circuit board is determined for each suction nozzle 1 beforehand, and image signals are outputted by the CCD 9 in an order corresponding to this order, an operation of placing an electronic component 2 to be placed first can be started at a point in time when recognition processing of an image signal outputted first is completed.

Then, the suction nozzles 1 of the head 12 performing a moving operation reach above the circuit board, the moving operation of the head 12 is stopped, operations of the head 12 and the suction nozzles 1 are controlled by the control unit 13 based on recognition results of image signals reserved by the control unit 13, and the electronic components 2 are successively placed onto the circuit board in the aforementioned order.

Furthermore, even when a placing operation of an electronic component 2 is started by the head 12 before recognition of image signals of all the electronic components 2 sucked and held by the suction nozzles 1 is completed, recognition processing of the image signals is performed in the aforementioned placement order. Therefore, while operations of placing electronic components 2 for which a placing operation can be started are successively performed from the electronic component 2 to be placed first, recognition processing of image signals is successively simultaneously performed for electronic components 2 for which image signal recognition processing is not completed, and placing operations of the electronic components 2 can be successively started.

Here, a specific example is explained with reference to FIG. 3. An electronic component 2 to be placed first is assumed as an electronic component (No. 1), a second one is assumed as an electronic component (No. 2) and thereafter an nth one is assumed as an electronic component (No. n) in the order in which the electronic components 2 are to be placed onto a circuit board. After image pickup of each electronic component 2, during successive recognition processing starting with an image signal of the electronic component (No. 1), the head unit 101 completes a moving operation and tries to proceed to a placing operation of electronic components 2. However, since the electronic components from (No. 1) to (No. 3) can already be placed, successive placing operations are performed starting with the electronic component (No. 1), and recognition processing of image signals of the fourth and subsequent electronic components (No. n) is simultaneously performed during this time.

Consequently, even though recognition processing of images of sucked and held states of all the electronic components is not completed, a method can be realized by which operations of placing electronic components can be performed at the same time as recognition processing work, and thus time required for mounting electronic components can be efficiently reduced.

This order of outputting image signals by the CCDs 9 may be the same for each movement of the head 12, or may be changed to an optimal order by the control unit 13 for each movement.

Furthermore, an order of placing the electronic components 2 onto the circuit board and an order of arrangement of the suction nozzles 1 may be unrelated. In the control unit 13, suction nozzles 1 for sucking and holding electronic components 2 can be arbitrarily set.

Furthermore, even when the image pickup device 14 does not include the lenses 7 and the CCDs 9 in the same number as that of the suction nozzles 1, but in a number less than that of the suction nozzles 1, images of electronic components 2 are picked up by the CCDs 9 in stages (step by step), and image pickup data signals of the images are successively outputted from the CCDs 9 to the camera unit 10. Consequently, when time required for this staged image pickup to each CCD 9 is so short that there is no time loss in time required for movement of the head unit 101 and mounting of each electronic component 2, a method, by which time required for mounting electronic components can be efficiently reduced, can be realized as in the case described above.

Furthermore, each suction nozzle 1 of the head 12 and each lens 7 of the image pickup device 14 can be individually attached or removed. Consequently, for example, when a large electronic component 40 such as a QFP is placed onto a circuit board, one suction nozzle 1 from among the suction nozzles 1 is replaced with a suction nozzle for the QFP, which can suck and hold the electronic component 40, in the head 12, and a lens 7 corresponding to the replaced suction nozzle is replaced with a lens for image pickup of the QFP, for example, a lens such as a lens with a large visual field and high resolution in the image pickup device 14. Consequently, the electronic component 40 can be placed onto the circuit board.

Furthermore, for example, it is possible that when a plurality of kinds of electronic components such as the electronic components 2 and the electronic component 40 are sucked and held by the suction nozzles 1 of the head 12 and placed onto the circuit board as described above, after picking up all the images of the electronic components 2 and the electronic component 40 by the image pickup device 14, instead of placing the electronic components 2 and electronic component 40 onto the circuit board, the images of the electronic components 2 are picked up by the image pickup device 14 and then the electronic components 2 are placed onto the circuit board, and thereafter the image of the electronic component 40 is picked up by the image pickup device 14 and then the electronic component 40 is placed onto the circuit board. It is noted that image pickup and placement of the electronic component 40 may precede those of the electronic component 2.

In a case where an image pickup error or recognition error occurs when the images of the electronic components 2 are picked up by the CCDs 9, or when the image signals of the images picked up by the CCDs 9 are recognized in the recognition processing unit of the control unit 13, the control unit 13 controls such that an operation of placing the electronic component 2 by the suction nozzle 1 corresponding to the CCD 9, in which the image pickup error or the recognition error occurs, is not performed.

Figure 6:
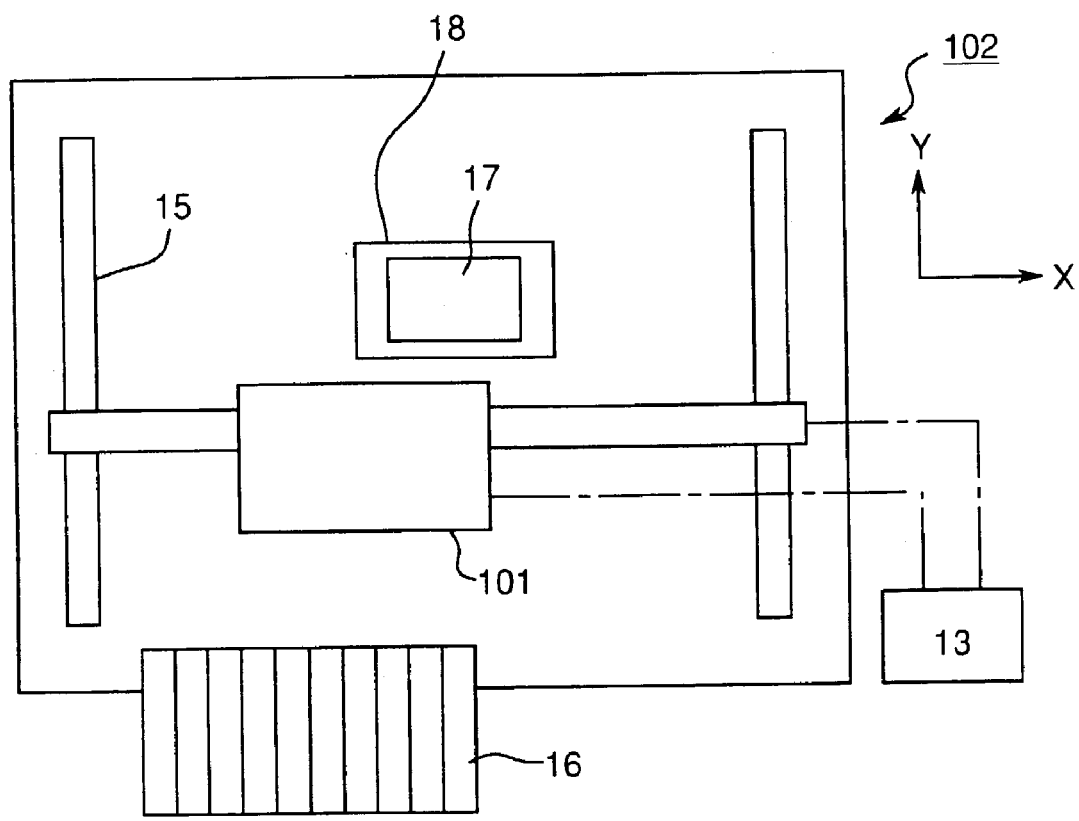
FIG. 6 is a schematic plan view showing an electronic component mounting apparatus according to the first embodiment.

FIG. 6 shows a schematic plan view of the electronic component mounting apparatus 102 equipped with the head unit 101 according to the first embodiment of the present invention.

In the electronic component mounting apparatus 102 shown in FIG. 6, the head unit 101 constituted by the head 12 and the image pickup device 14 is attached to an XY robot 15 as one example of a moving device for moving the head unit 101. The XY robot 15 includes a movable beam that can reciprocally move in the shown Y-axis direction while supported by two rod-like support members fixed at two end portions opposed to each other on an upper surface of the electronic component mounting apparatus 102, and a movable table that can reciprocally move in the shown X-axis direction on this movable beam, and the head unit 101 is attached to this movable table. Consequently, the head unit 101 can be reciprocally moved by the XY robot 15 in the shown X-axis direction or Y-axis direction.

Further, a plurality of electronic components 2 are housed in an electronic component feeding unit 16 and arranged so that they can be fed, and a circuit board 17 onto which the electronic components 2 are to be placed is fixed in an electronic component placement unit 18. Details of the component members constituting the head unit 101 are as shown in FIGS. 1, 2 and 4.

Further, in the electronic component mounting apparatus 102, moving operations of the XY robot 15 and operations of the head unit 101 are controlled by the control unit 13.

Operations of component members of the electronic component mounting apparatus 102 are explained below with reference to FIGS. 1, 2, 4 and 6.

First, in FIG. 6, the head unit 101 is moved to above the electronic component feeding unit 16 by the XY robot 15 and stopped so that electronic components 2 arranged in the electronic component feeding unit 16 can be sucked and held by suction nozzles 1 of the head unit 101. Then, after the suction nozzles 1 are lowered to suck and hold the electronic components 2 and then raised, movable mirror 4 positioned at a raised position shown in FIG. 4 is moved to a lowered position, and movement of the head unit 101 is started by the XY robot 15 so that the head unit 101 proceeds towards above the circuit board 17 fixed on the electronic component placement unit 18.

Subsequently, when movement of the movable mirror 4 to the lowered position is completed during the movement of the head unit 101, an illumination unit 3 is turned on and the electronic components 2 sucked and held by the suction nozzles 1 are illuminated with light of the illumination unit 3, and images of the electronic components 2 sucked and held by the suction nozzles 1 are picked up by the CCDs 9 in the image pickup device 14 during this illumination.

After this image-pickup by the CCDs 9 is completed, the illumination unit 3 is turned off, and the movable mirror 4 is moved to the raised position. Along with this, image pickup data signals are outputted from the CCDs 9, and the signals are processed in the camera unit 10 to be outputted as image signals to the control unit 13. At this time, since the image pickup data signals outputted from the CCDs 9 are successively outputted without overlapping, the signals are also successively processed in the camera unit 10 and successively outputted to the control unit 13 as image signals. These received image signals are also successively recognized in the control unit 13.

Here, an order of placing the electronic components 2 sucked and held by the suction nozzles 1 onto the circuit board 17 is determined for each suction nozzle 1 beforehand. When image signals from the CCDs 9 are outputted in an order corresponding to this order, an operation of placing an electronic component 2 to be placed first onto the circuit board 17 can be started at a point in time when recognition processing of an image signal to be outputted first is completed.

Then, the suction nozzles 1 of the head unit 101 performing a moving operation reach above the circuit board 17 in the electronic component placement unit 18, a moving operation of the head unit 101 by the XY robot 15 is stopped, and operations of the head 12 and the suction nozzles 1 in the head unit 101 are controlled by the control unit 13 based on recognition results of the image signals received by the control unit 13 to successively place the electronic components 2 on the circuit board 17 in the aforementioned order so that electronic components 2 are placed at positions of the circuit board 17 set beforehand.

Furthermore, even in a case where operations of placing the electronic components 2 onto the circuit board 17 by the head unit 101 are started before recognition processing of image signals of all the electronic components 2 sucked and held by the suction nozzles 1 is completed, since recognition processing of the image signals is performed in the aforementioned placing order, operations of placing electronic components 2 for which placing operations can be started are performed successively starting with the electronic component 2 to be placed first, while recognition processing of the image signals of the electronic components 2 for which image signal recognition processing is not completed is successively performed simultaneously, and operations of placing electronic components 2 onto the circuit board 17 can be successively started.

Consequently, a mounting method and mounting apparatus can be realized, by which operations of placing the electronic components can be performed at the same time as recognition processing work even when recognition processing of images of sucked and held states of all the electronic components is not completed, so that time required to mount electronic components is efficiently reduced.

Figure 7:
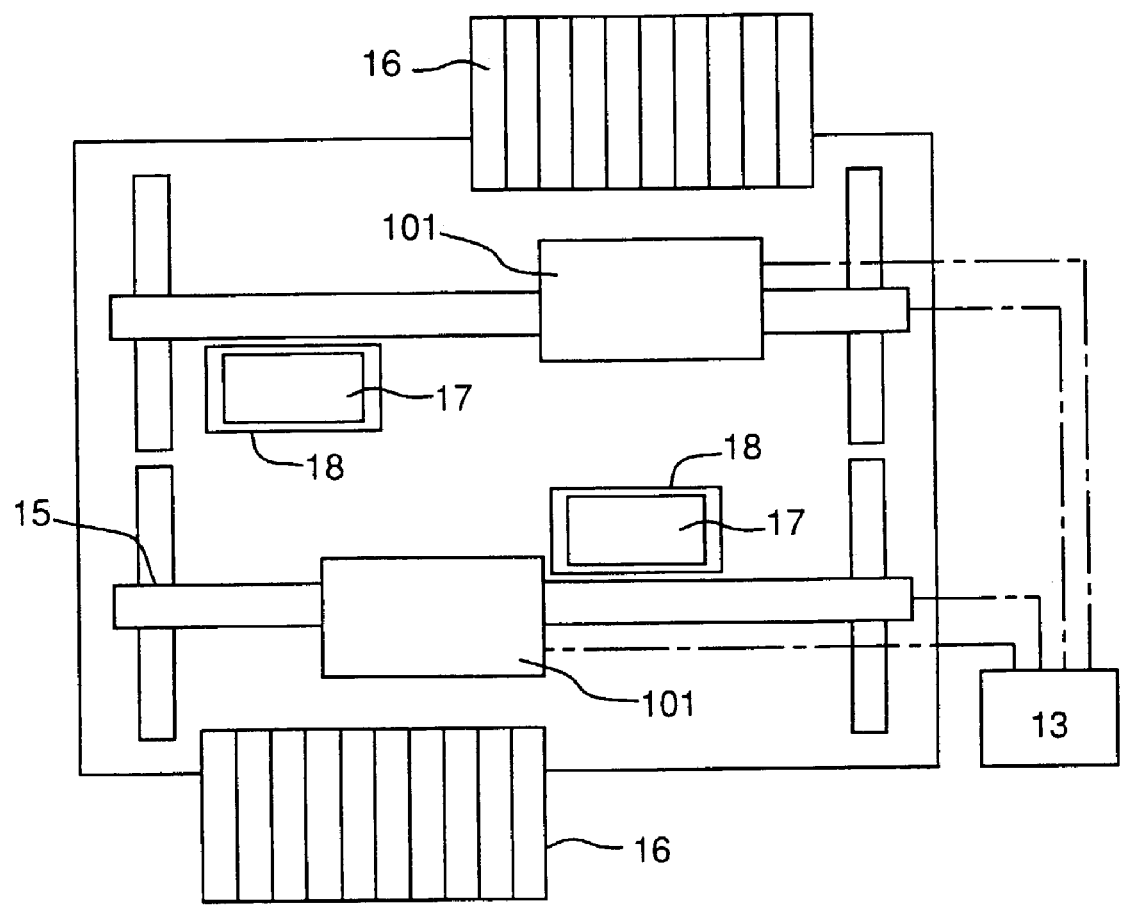
FIG. 7 is a schematic plan view showing another example of the electronic component mounting apparatus according to the first embodiment.

Further, as shown in FIG. 7, the head unit 101, XY robot 15, electronic component feeding unit 16, and electronic component placement unit 18 are arranged in pairs in the electronic component mounting apparatus and operated simultaneously. Consequently, electronic components in an amount twice as many can be mounted by this one electronic component mounting apparatus, and an electronic component mounting apparatus can be realized in which time for mounting electronic components per one circuit board can be reduced in half, resulting in higher speed.

According to the first embodiment, various effects described below can be obtained.

First, in the head unit 101, the image pickup device 14 is equipped with the CCDs 9 corresponding to the suction nozzles 1 of the head 12 one to one, and time required for image pickup can be reduced since images of sucked and held states of the electronic components 2 sucked and held by the suction nozzles 1 are simultaneously picked up by the CCDs 9 during a process of moving the head unit 101 from suction and holding of the electronic components 2 to placement thereof.

Furthermore, in the image pickup device 14, after simultaneous image pickup of the electronic components 2 by the CCDs 9, image pickup data signals are outputted from the CCDs 9 in the order of placing the electronic components 2 sucked and held by the suction nozzles 1 onto the circuit board 17, successively processed by the camera unit 10 in the aforementioned placing order, and successively outputted to the control unit 13 as image signals. Consequently, in the control unit 13, an operation of placing an electronic component 2 to be placed first onto the circuit board 17 can be started at a point in time when recognition processing of an image signal to be outputted first is completed.

Furthermore, even in a case where operations of placing the electronic components 2 onto the circuit board 17 by the head unit 101 are started before the recognition processing of the image signals of all the electronic components 2 sucked and held by the suction nozzles 1 is completed, since the recognition processing of the image signals is performed in the aforementioned placing order, operations of placing the electronic components 2 for which placing operation can be started are performed successively starting with an electronic component 2 to be placed first, while recognition processing of the image signals of the electronic components 2 for which image signal recognition processing is not completed is successively performed simultaneously, and operations of placing the electronic components 2 onto the circuit board 17 can be successively started.

Consequently, a mounting method and mounting apparatus can be realized, by which operations of placing electronic components can be performed at the same time as recognition processing work even when recognition processing of images of sucked and held states of all the electronic components is not completed, so that time required to mount electronic components is efficiently reduced.

Furthermore, since the image pickup data signals outputted from the respective CCDs 9 do not overlap but are successively outputted, these signals are also successively processed in the camera unit 10 and successively outputted to the control unit 13 as image signals. Consequently, the recognition processing unit in the control unit 13 for receiving the image signals and performing recognition processing needs to be equipped with only one system of an I/F for each image signal and a processing system. Since it is sufficient that a scale of the recognition processing unit is small, costs of the electronic component mounting apparatus can be reduced.

Furthermore, since the head units 101, XY robots 15, electronic component feeding units 16 and electronic component placement units 18 are arranged in two pairs in the electronic component mounting apparatus and operated simultaneously, the electronic component mounting apparatus can be provided in which twice as many electronic components can be mounted by this one electronic component mounting apparatus, and time for mounting electronic components per one circuit board can be reduced in half.

Furthermore, since each suction nozzle 1 of the head 12 and each lens 7 of the image pickup device 14 can be individually attached and removed, when a large electronic component 40 such as, for example, a QFP is placed onto the circuit board, one suction nozzle 1 of the suction nozzles 1 is replaced with a suction nozzle for the QFP, which can suck and hold the electronic component 40, in the head 12, and the lens 7 corresponding to this replaced suction nozzle is replaced with a lens for image pickup of the QFP, for example, a lens such as a lens with a large visual field and high resolution in the image pickup device 14. Consequently, placement of the electronic component 40 onto the circuit board can be addressed, and an electronic component mounting apparatus can be provided in which mounting of more kinds of electronic components can be addressed.

Figure 8:
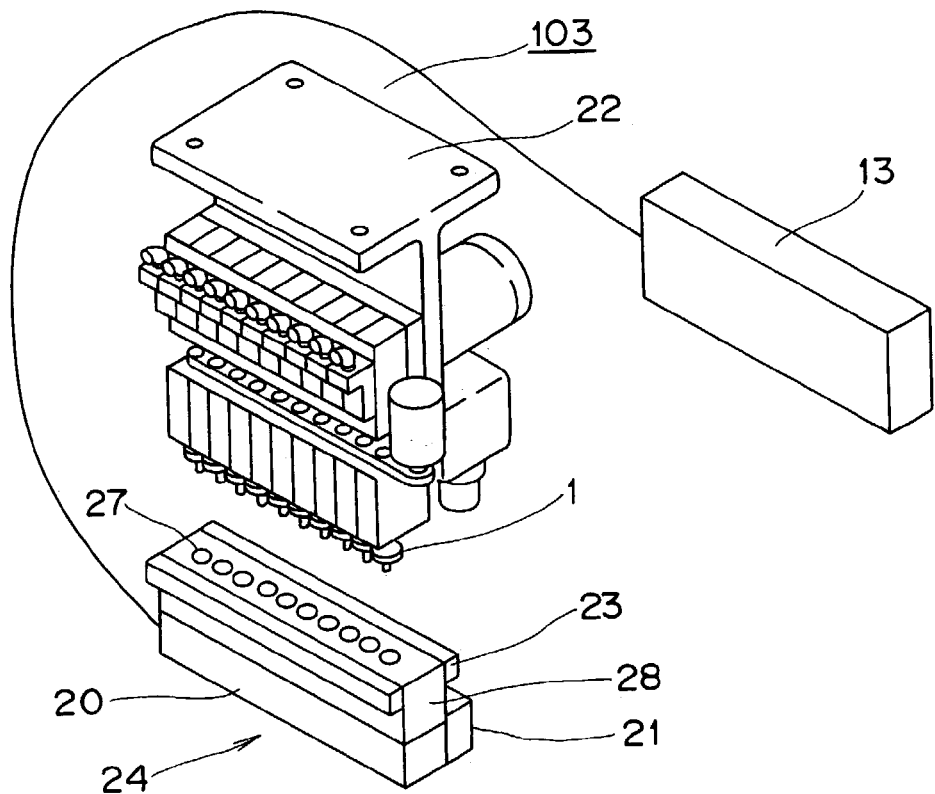
FIG. 8 is a perspective view showing a head unit and an image pickup device according to a second embodiment of the present invention.
Figure 9:
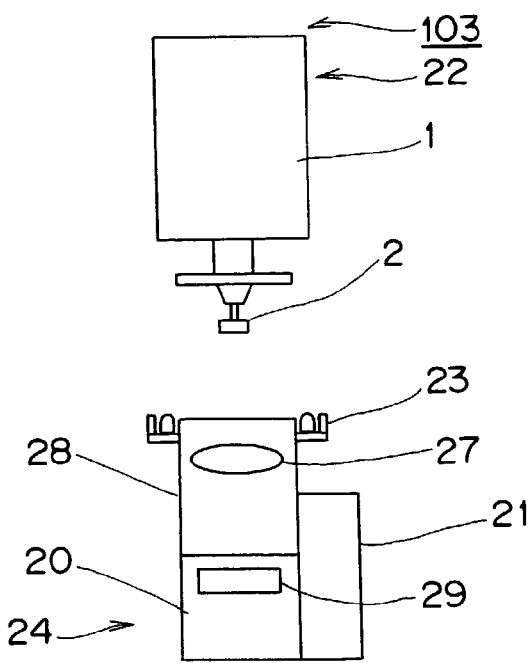
FIG. 9 is a schematic constituent view showing the head unit and the image pickup device in FIG. 8.

The scope of the present invention is not limited to this embodiment, and can be implemented in other various aspects. For example, FIG. 8 is a perspective view showing a head 22 of a head unit 103 as one example of a component holding unit and an image pickup device 24 in an electronic component mounting apparatus according to a second embodiment of the present invention. FIG. 9 is a schematic constituent view schematically showing constructions of the head 22 and the image pickup device 24.

In FIGS. 8 and 9, the head unit 103 is equipped with only the head 22 for handling electronic components 2, and the image pickup device 24 for performing image pickup of the electronic components 2 is disposed independently of the head unit 103 separately. Since the image pickup device 24 is separate from the head unit 103, arrangement or operations of illumination units 23, lenses 27, lens barrel 28, CCDs 29 and signal recognition unit 20 in the image pickup device 24 are different from those of the head unit 101 of the first embodiment. Accordingly, only these different portions are explained before.

First, the image pickup device 24 is equipped with the illumination units 23 for directly illuminating the electronic components 2 sucked and held by the suction nozzles 1 of the head with light, the lenses 27 for forming images of the electronic components 2, the lens barrel 28 for holding each of the lenses 27, the CCDs 29 as one example of image pickup elements for picking up images of electronic components 2 sucked and held by the suction nozzles 1 formed by each lens 27, and a camera unit 10 for processing image pickup data signals outputted from the CCDs 29 and outputting these signals to the control unit 13 as image signals. Furthermore, there are provided the same functions for image pickup and recognition processing of the image signals as the functions of the image pickup device 12 in the head unit 101 according to the first embodiment of the present invention.

First, the image pickup device 24 is equipped with the lenses 27 for forming images of electronic components 2, and the CCDs 29 for picking up the images formed by the lenses 27. Ten each of the lenses and CCDs, which is the same number as that of the suction nozzles 1 of the head 22, are arranged adjacent each other in one line, and these lenses 27 and CCDs 29 correspond to respective suction nozzles 1 one to one. Furthermore, the lenses 27 are held in an upper portion inside the square-cylindrical lens barrel 28, and the CCDs 29 are installed in a connecting portion with a lower portion of the lens barrel 28 in the camera unit 20, which are disposed and fixed in the lower portion of the lens barrel 28.

Furthermore, the illumination units 23 are attached facing upward on both sides along a direction in which the lenses 27 are arranged along an outer periphery of the upper portion of the lens barrel 28 so that light can be emitted in an upward direction, and an illumination control unit 21 for controlling intensities of illumination, and turning on/off, of these illumination units 23 is fixed on sides of the camera unit 20 and the lens barrel 28.

The image pickup device 24 constituted by the illumination units 23, lenses 27, lens barrel 28, CCDs 29, camera unit 10, and illumination control unit 21 is disposed in a direction opposed to the suction nozzles 1 in the head 22 and fixed on the electronic component mounting apparatus separately from the head 22.

Furthermore, in the image pickup device 24, respective centers of one CCD 29 and the lens 27 corresponding thereto are positioned coaxially, and, with this axis as an optical axis, light emitted upward along this optical axis in parallel by the illumination unit 23 illuminates the electronic component 2 sucked and held by the suction nozzle 1 corresponding to the CCD 29 and the lens 27 from a downward position. Consequently, images of the electronic components 2 enter the lenses 27 in parallel along the optical axis, and the images are formed by the lenses 27 and picked up by the CCDs 29.

Furthermore, in FIGS. 8 and 9, the suction nozzles 1 sucking and holding the electronic components 2 in the head 22 are moved so as to pass above the lenses 27 of the image pickup device 24 during movement from positions at which the electronic components 2 are sucked and held to positions at which the electronic components 2 are placed onto a circuit board. When the suction nozzles 1 pass above the lenses 27, the head 22 is moved so that all the suction nozzles 1 simultaneously correspond to the lenses 27 along optical axes one to one.

At the moment when the suction nozzles 1 in the head 22 pass above respective optical axes of the lenses 27 in the image pickup device 24, the illumination units 23 are turned on in the image pickup device 24 to directly illuminate the electronic components 2 with light, and images of the electronic components 2 are simultaneously picked up by the CCDs 29 by using an electronic shutter function of the image pickup device 24. When image pickup by the CCDs 29 is completed, the camera unit 20 processes image pickup data signals outputted from the CCDs 29 in an order set in the control unit 13 beforehand, and successively outputs these signals to the control unit 13 as image signals. Furthermore, when exposure time to the CCDs 29 by the electronic shutter function in the image pickup device 24 is made sufficiently short for a travel speed of the head 22, static images of the electronic components 2 sucked and held by the suction nozzles 1 can be picked up at the moment when the head 22 passes immediately above the lenses 27 of the image pickup device 24. Consequently, positions of the electronic components 2 relative to the suction nozzles 1 can be obtained in the control unit 13, and hence the electronic components 2 can be placed at positions set on the circuit board beforehand.

Figure 10:
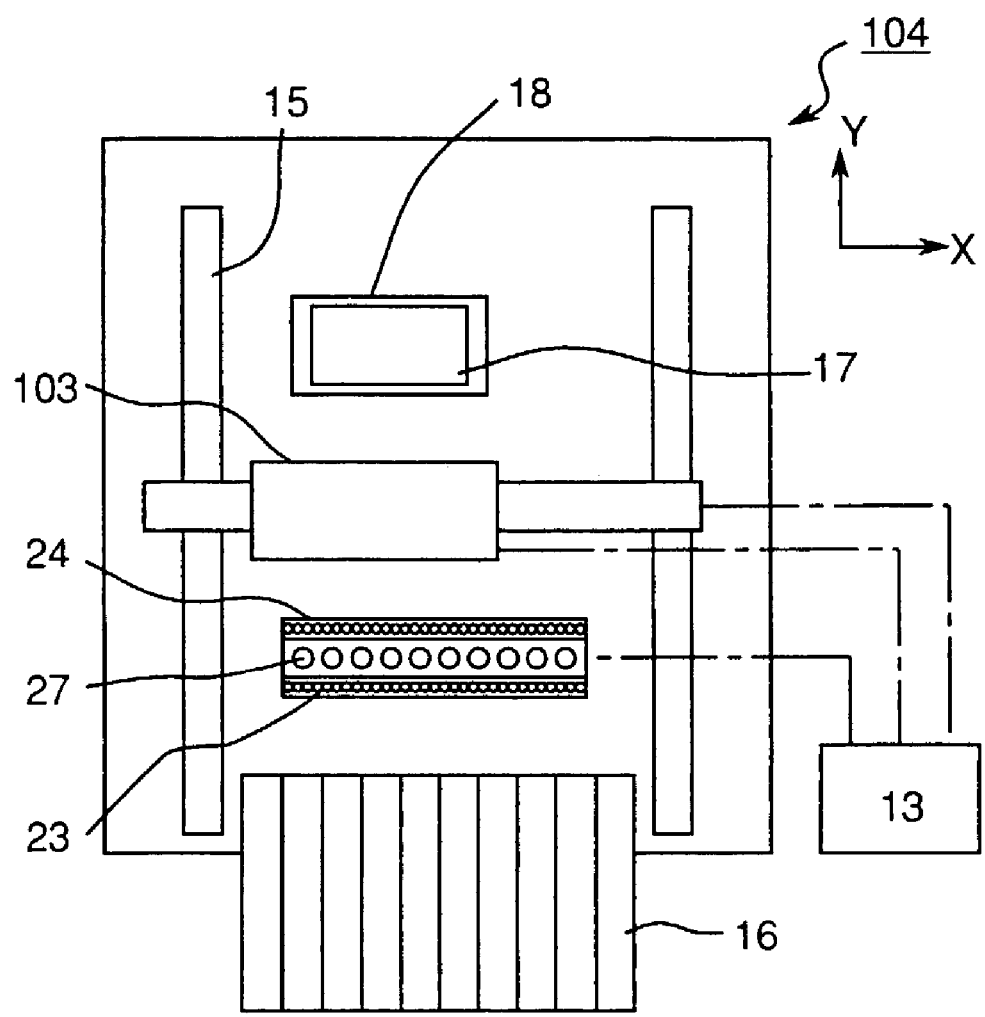
FIG. 10 is a schematic plan view showing an electronic component mounting apparatus according to the second embodiment.

FIG. 10 is a schematic plan view showing the electronic component mounting apparatus 104 equipped with the head 22 of the head unit 103 and the image pickup device 24 according to the second embodiment of the present invention.

In the electronic component mounting apparatus 104 shown in FIG. 10, the head 22 can be reciprocally moved by XY robot 15 in the shown X-axis direction or Y-axis direction, and the image pickup device 24 is fixed on a machine base of a main body of the electronic component mounting apparatus 104. Furthermore, the image pickup device 24 is disposed so that the lenses 27 in the image pickup device 24 are opposed to the suction nozzles 1 in the head 22. The XY robot 15 is the same as the XY robot 15 in the electronic component mounting apparatus 102 of the first embodiment.

Furthermore, in the electronic component mounting apparatus 104, moving operations of the XY robot 15, operations of the head unit 103 and operations of the image pickup device 24 are controlled by the control unit 13.

A mounting operation performed by the electronic component mounting apparatus 104 having the constitution based on FIGS. 8, 9 and 10 is explained below.

Figure 11:
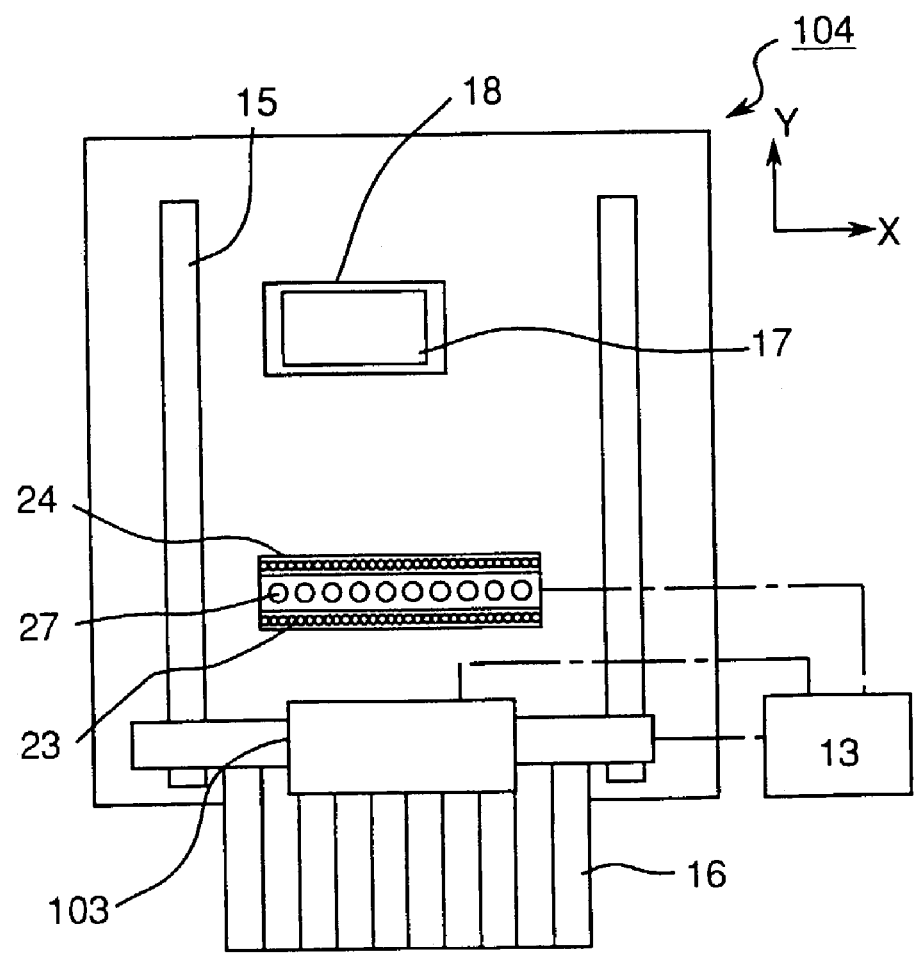
FIG. 11 is a schematic plan view showing the electronic component mounting apparatus shown in FIG. 10 when electronic components are sucked and held.

First, as shown in FIG. 11, the head unit 103 is moved to above an electronic component feeding unit 16 by the XY robot 15 and stopped so that electronic components 2 arranged in the electronic component feeding unit 16 are sucked and held by the suction nozzles 1 of the head unit 103. Then, after the suction nozzles 1 are lowered to suck and hold the electronic components 2 and then raised, movement of the head unit 103 is started by the XY robot 15 so that the head unit 103 proceeds towards above a circuit board 17 fixed in an electronic component placement unit 18. At this time, the head unit 103 is not moved on a line connecting the electronic component feeding unit 16 and the electronic component placement unit 18 fixing the circuit board 17, but is moved so that the suction nozzles 1 of the head unit 103 are moved above the optical axes of the lenses 27 corresponding to the lenses 27 in the image pickup device 24 one to one.

Figure 12:
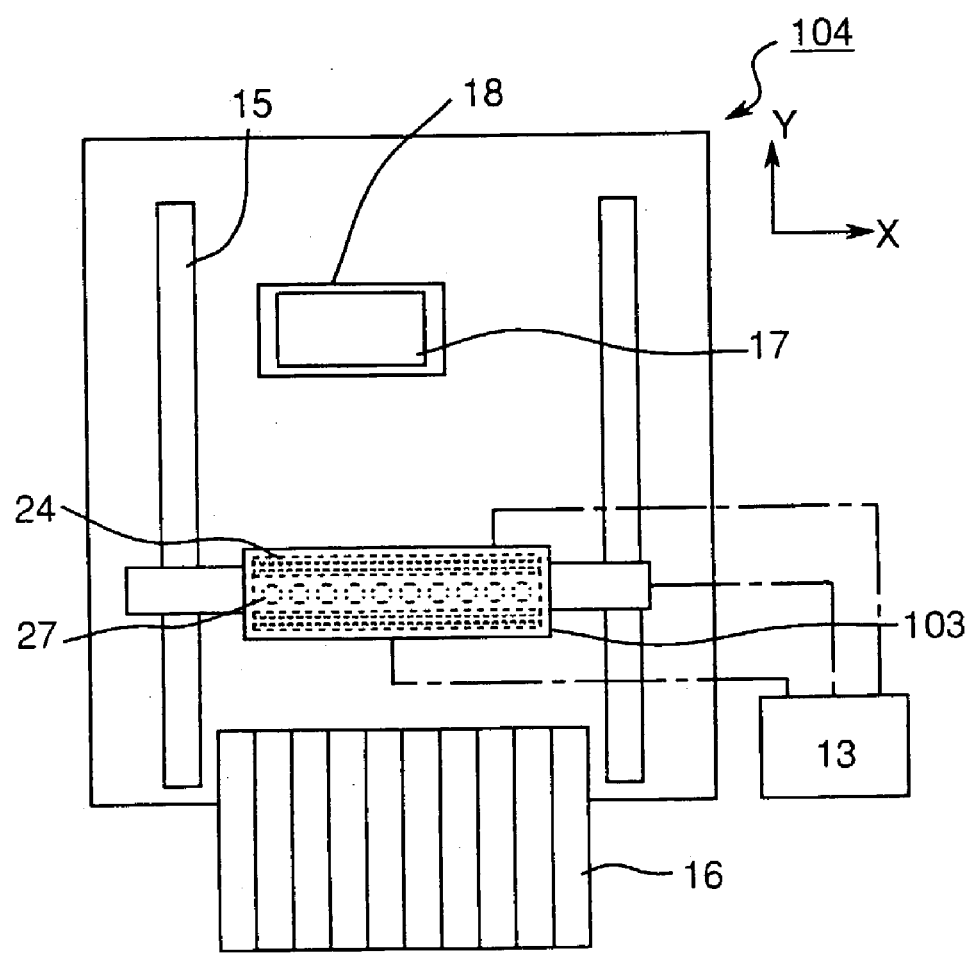
FIG. 12 is a schematic plan view showing the electronic component mounting apparatus shown in FIG. 10 when images are picked up.

Subsequently, in FIG. 12, at the moment when the suction nozzles 1 of the head unit 103 pass above the optical axes in the image pickup device 24 for the corresponding lenses 27 one to one, the illumination units 23 are turned on, the electronic components 2 sucked and held by the suction nozzles 1 are directly illuminated with light from the illumination units 23, and, during this illumination, in the image pickup device 24, images of electronic components 2 sucked and held by the suction nozzles 1 in the head unit 103 are picked up by the CCDs 9 in a short time by using an electronic shutter function of the image pickup device 24. Thus, by performing image pickup while the head unit 103 is being moved, the images of the electronic components 2 can be picked up without stopping movement of the head unit 103.

After completion of the image pickup by the CCDs 9, the illumination units 23 are turned off, and image pickup data signals are outputted from the CCDs 29, processed in the camera unit 20, and outputted to the control unit 13 as image signals. At this time, since image pickup data signals outputted from the CCDs 29 do not overlap but are successively outputted, the signals are successively processed in the camera unit 20 and successively outputted to the control unit 13 as image signals, and these received image signals are also successively recognized (processed for recognition) in the control unit 13.

Here, for each suction nozzle 1, an order of placing the electronic components 2 sucked and held by the suction nozzles 1 onto the circuit board 17 is determined beforehand. When image signals from the CCDs 9 are outputted in an order corresponding to this order, an operation of placing an electronic component 2 to be placed first onto the circuit board 17 can be started at a point in time when recognition processing of an image signal to be outputted first is completed.

Figure 13:
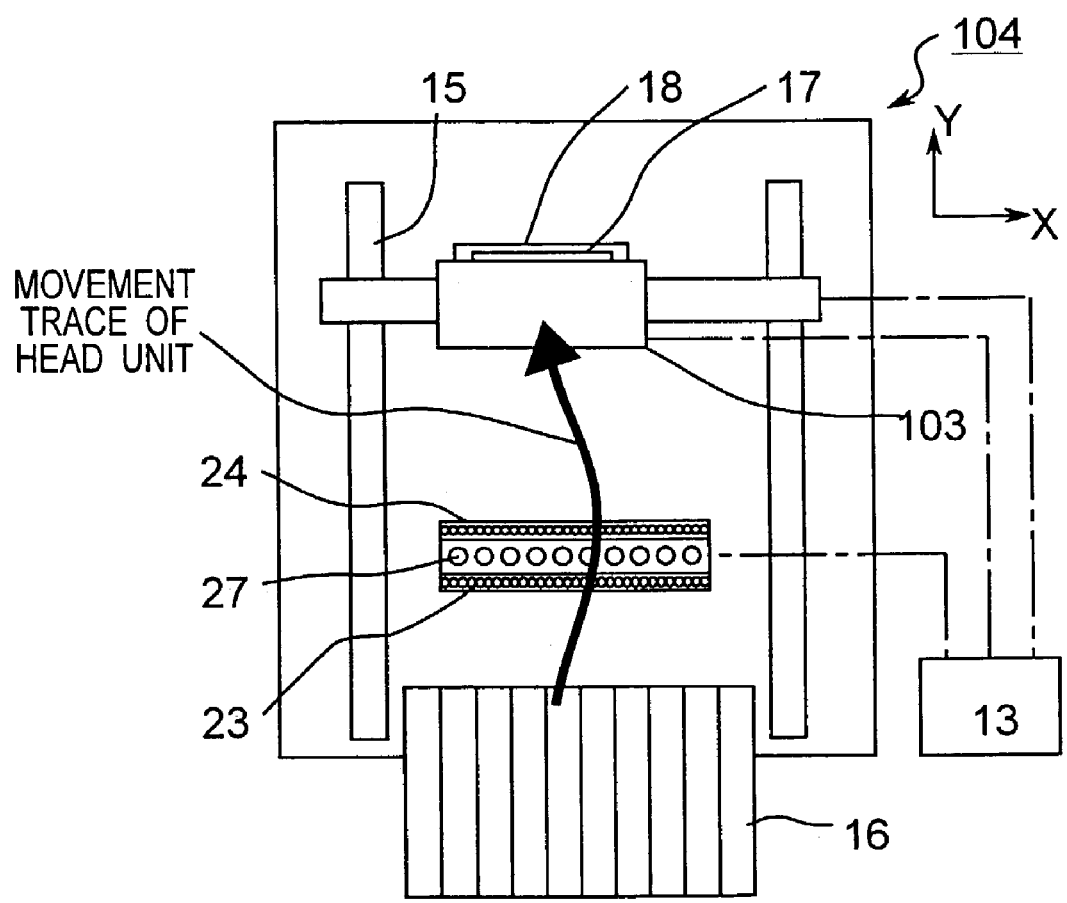
FIG. 13 is a schematic plan view showing the electronic component mounting apparatus shown in FIG. 10 when electronic components are placed.

Then, as shown in FIG. 13, the suction nozzles 1 of the head unit 103 performing a moving operation reach above the circuit board 17 in the electronic component placement unit 18, the moving operation of the head unit 103 by the XY robot 15 is stopped, and operations of head 12 and the suction nozzles 1 in the head unit 103 are controlled by the control unit 13 to successively place the electronic components 2 onto the circuit board 17 in the aforementioned order based on recognition results of the image signals received by the control unit 13 so that the electronic components 2 are placed at positions set on the circuit board 17 beforehand.

Furthermore, even in a case where operations of placing the electronic components 2 onto the circuit board 17 by the head unit 103 are started before recognition processing of image signals of all the electronic components 2 sucked and held by the suction nozzles 1 is completed, since recognition processing of the image signals is performed in the aforementioned placing order, operations of placing electronic components 2 for which placing operation can be started are performed successively starting with an electronic component 2 to be placed first, while recognition processing of the image signals of the electronic components 2 for which image signal recognition processing is not completed is successively performed simultaneously, and operations of placing the electronic components 2 onto the circuit board 17 can be successively started.

Consequently, a mounting method and mounting apparatus can be realized, by which operations of placing the electronic components can be performed at the same time as recognition processing work even when recognition processing of images of sucked and held states of all the electronic components is not completed, so that time required to mount electronic components is efficiently reduced.

According to the second embodiment, the head 22 and the image pickup device 24 are not integrated and each is independently disposed, with the image pickup device 24 being disposed in a direction so that the lenses 27 in the image pickup device 24 and the suction nozzles 1 in the head 22 are opposed to each other, and the image pickup device being fixed on the electronic component mounting apparatus 104. The illumination units 23 are turned on in the image pickup device 24 to directly illuminate the electronic components 2 with light at the moment when the suction nozzles 1 in the head 22 pass above optical axes of the lenses 27 in the image pickup device 24, and, at the same time, the images of the electronic components 2 are simultaneously picked up by the CCDs 29 by using the electronic shutter function of the image pickup device 24 so that the same effects as the effects by the first embodiment can be obtained.

In addition, since the image pickup device 24 constituted by the illumination units 23, lenses 27, lens barrel 28, CCDs 29, camera unit 20 and illumination control unit 11 is constituted separately from the head 22, a weight of the head 22 can be reduced. Therefore, without changing an output of a drive system for driving the head 22, a travel speed of the head 22 can be increased, and a mounting method by which electronic components can be mounted in a short time can be provided.

Figure 14:
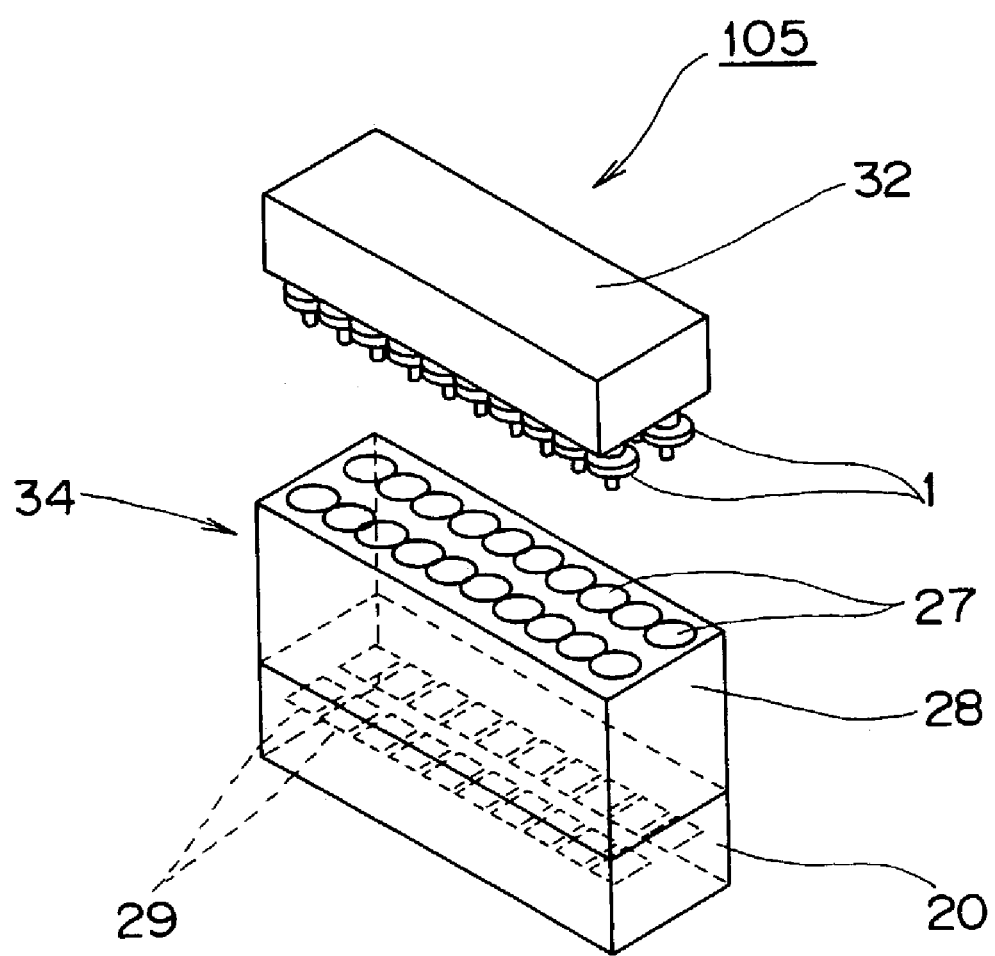
FIG. 14 is a schematic constituent view showing a head unit and an image pickup device according to a third embodiment of the present invention.

FIG. 14 is a schematic constituent view showing a head 32 of head unit 105 as one example of a component holding unit and an image pickup device 34 in an electronic component mounting apparatus according to a third embodiment of the present invention. Since the head 32 and the image pickup device 34 shown in FIG. 14 are the same as the head 22 and the image pickup device 24 in the second embodiment of the present invention except for an arrangement of suction nozzles 1, lenses 27 and CCDs 29, only different portions are explained below.

As shown in FIG. 14, in the head 32, suction nozzles 1 are arranged in a grid with two rows and ten columns. Furthermore, in the image pickup device 34, the lenses 27 are also arranged in a grid with two rows and ten columns so as to correspond to the suction nozzles 1 in the head 32. Furthermore, the CCDs 29 are also arranged so as to correspond to the suction nozzles 1 and the lenses 27 one to one, and images of electronic components 2 sucked and held by the suction nozzles 1 are formed by the CCDs 29 through the lenses 27 so that the images of the electronic components 2 are picked up.

Furthermore, in the electronic component mounting apparatus equipped with such a head tool 105, operations of the electronic component mounting apparatus, timing of image pickup and the like are controlled in the same manner as in the electronic component mounting apparatus 104 according to the second embodiment of the present invention.

Furthermore, arrangement of the suction nozzles 1, lenses 27 and CCDs is not limited by the aforementioned numerical values, and these component members may be arranged in a grid with an arbitrary multiple number of rows and columns depending on a size or the like of the electronic component mounting apparatus.

According to the third embodiment, since the suction nozzles 1 in the head 32 and the lenses 27 in the image pickup device 34 are arranged in a grid with a plurality of rows and columns such as two rows and ten columns, the size of head 32 in a lateral width direction can be reduced in comparison with a case where these are arranged in one row and a plurality of columns, and hence a head equipped a multiplicity of suction nozzles can be mounted on one electronic component mounting apparatus. Consequently, the same number of electronic components as the number of the suction nozzles can be mounted on a circuit board by one suction and holding, and the electronic component mounting apparatus can be provided in which time for mounting electronic components per one circuit board can be further reduced.

Along with the above, by making the head 32 smaller, a small-size electronic component mounting apparatus can be realized, and area productivity can be improved as can an entire production line for mounting the electronic components onto the circuit board.

Figure 15:
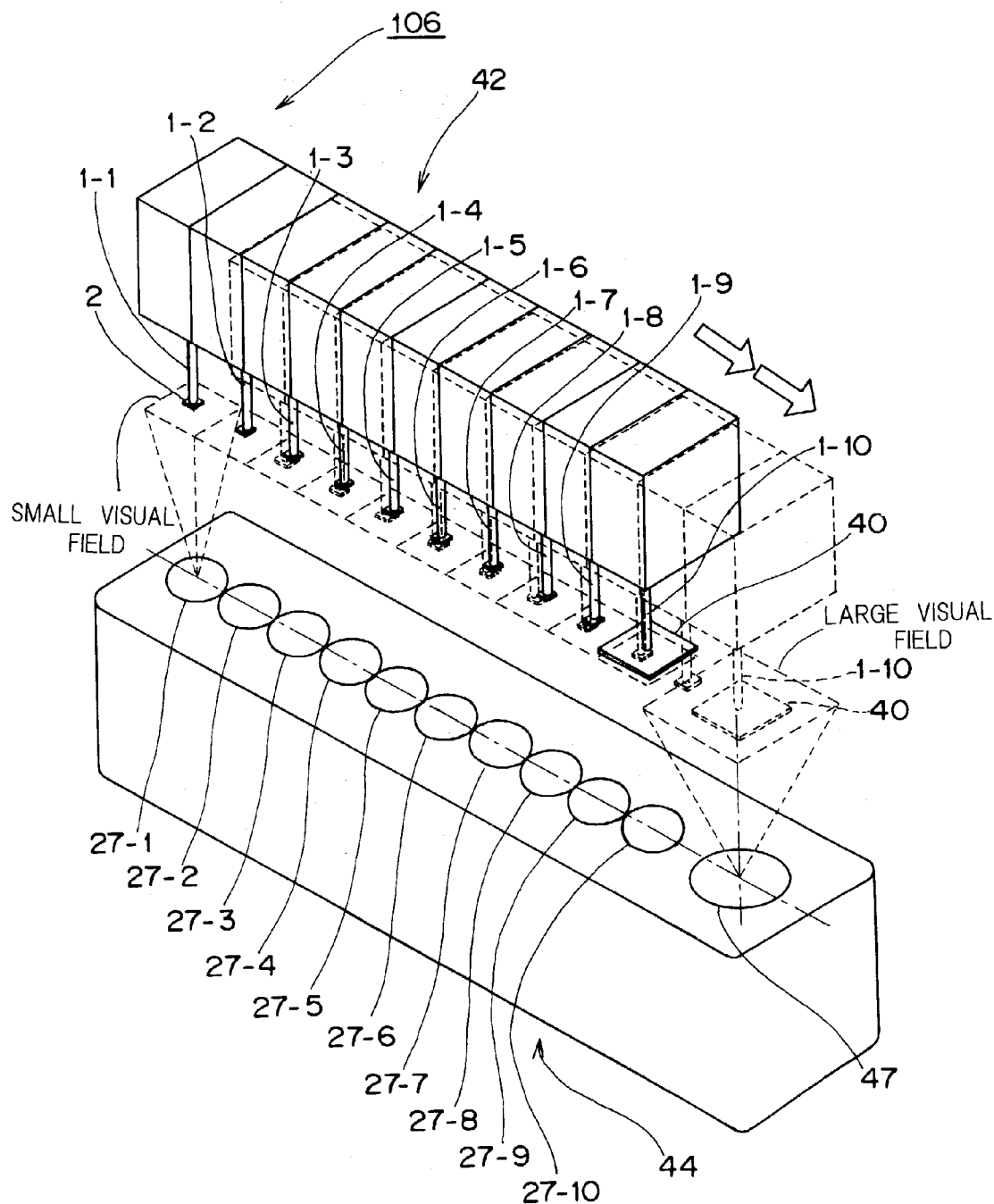
FIG. 15 is a schematic constituent view showing a head unit and an image pickup device according to a fourth embodiment of the present invention.

FIG. 15 is a schematic constituent view schematically showing a configuration of a head 42 of a head unit 106 as one example of a component holding unit and an image pickup device 44 in an electronic component mounting apparatus according to a fourth embodiment of the present invention. In addition to the lenses 27 of the image pickup device 24 according to the second embodiment of the present invention, the head unit 106 shown in FIG. 15 further includes an image pickup device 44 equipped with a lens 47 of a different kind from the lenses 27. Only portions different from the second embodiment are explained in the description of the fourth embodiment.

As shown in FIG. 15, the head 42 includes ten suction nozzles 1 arranged adjacent each other in a line as in the case of the head 22 of the second embodiment. Meanwhile, in the image pickup device 44, ten lenses 27 for forming images of electronic components 2 are arranged adjacent each other in a line in the same number as the suction nozzles 1 in the head 42. Furthermore, the lens 47 of a different kind from the lenses 27 is disposed to the right of the lenses 27 at the right end in FIG. 15.

Furthermore, the lens 47 is a lens with a large visual field and high-resolution, which has a larger visual field and higher resolution than those of lens 27. Consequently, when an electronic component sucked and held by suction nozzle 1 is a larger electronic component, an image of the electronic component can be formed in the lens 47.

It is noted that a CCD 29 for picking up an image formed by the lens 47 is included in the image pickup device 44.

In the electronic component mounting apparatus including the head unit 106 and the image pickup device 44 having such a constitution, image pickup of electronic components when a plurality of electronic components including two kinds of electronic components, that is, first electronic components and second electronic components, are mounted onto a circuit board is explained below with reference to the following working examples. As one example of the first electronic component, an electronic component 2 such as a chip component is used, and as one example of the second electronic component, an electronic component 40 such as a QFP, which is larger than the chip component, is used.

First, in FIG. 15, the ten suction nozzles 1 are designated as suction nozzle 1-1 to suction nozzle 1-10 in order from the left side, and similarly the ten lenses 27 are designated as lens 27-1 to lens 27-10 in order from the left side. In the head 42, the electronic components 2 are sucked and held by the suction nozzle 1-1 to the suction nozzle 1-9, and the electronic component 40 is sucked and held by the suction nozzle 1-10.

Then, while being moved from positions at which the electronic components 2 and the electronic component 40 are sucked and held to positions at which the electronic components 2 and the electronic component 40 are placed onto a circuit board, the suction nozzles 1 of the head 42 are moved above the lenses 27 of the image pickup device 44. When respective centers of the suction nozzle 1-1 to the suction nozzle 1-9 of the head 42 are positioned so as to be simultaneously positioned above optical axes of the lens 27-1 to the lens 27-9 of the image pickup device 44, which correspond one to one, a moving operation of the head 42 is temporarily stopped, and images of the electronic components 2 sucked and held by the suction nozzle 1-1 to the suction nozzle 1-9 are simultaneously formed by the lens 27-1 to the lens 27-9 of the image pickup device 44 and picked up by the CCDs 29.

Then, this temporarily stopped head 42 is moved so that a center of the suction nozzle 1-10 passes above on an optical axis of the lens 47, and, at the moment when the center of the suction nozzle 1-10 passes above the optical axis of the lens 47, an image of the electronic component 40 sucked and held by the suction nozzle 1-10 is formed by the lens 47 by using an electronic shutter function of the image pickup device 44 and picked up by the CCD 29. Then, the head 42 is moved to positions at which the electronic components 2 and the electronic component 40 are placed onto the circuit board.

In this working example, a case where the electronic component 40 is sucked and held by the suction nozzle 1-10 is explained, but the suction nozzle 1 for sucking and holding the electronic component 40 may be any of the suction nozzle 1-1 to suction nozzle 1-10. Furthermore, the order of picking up images of the electronic components 2 and the electronic component 40 by the image pickup device 44 may be such that the image of the electronic component 40 is picked up and then the images of the electronic components 2 are picked up.

Figure 16:
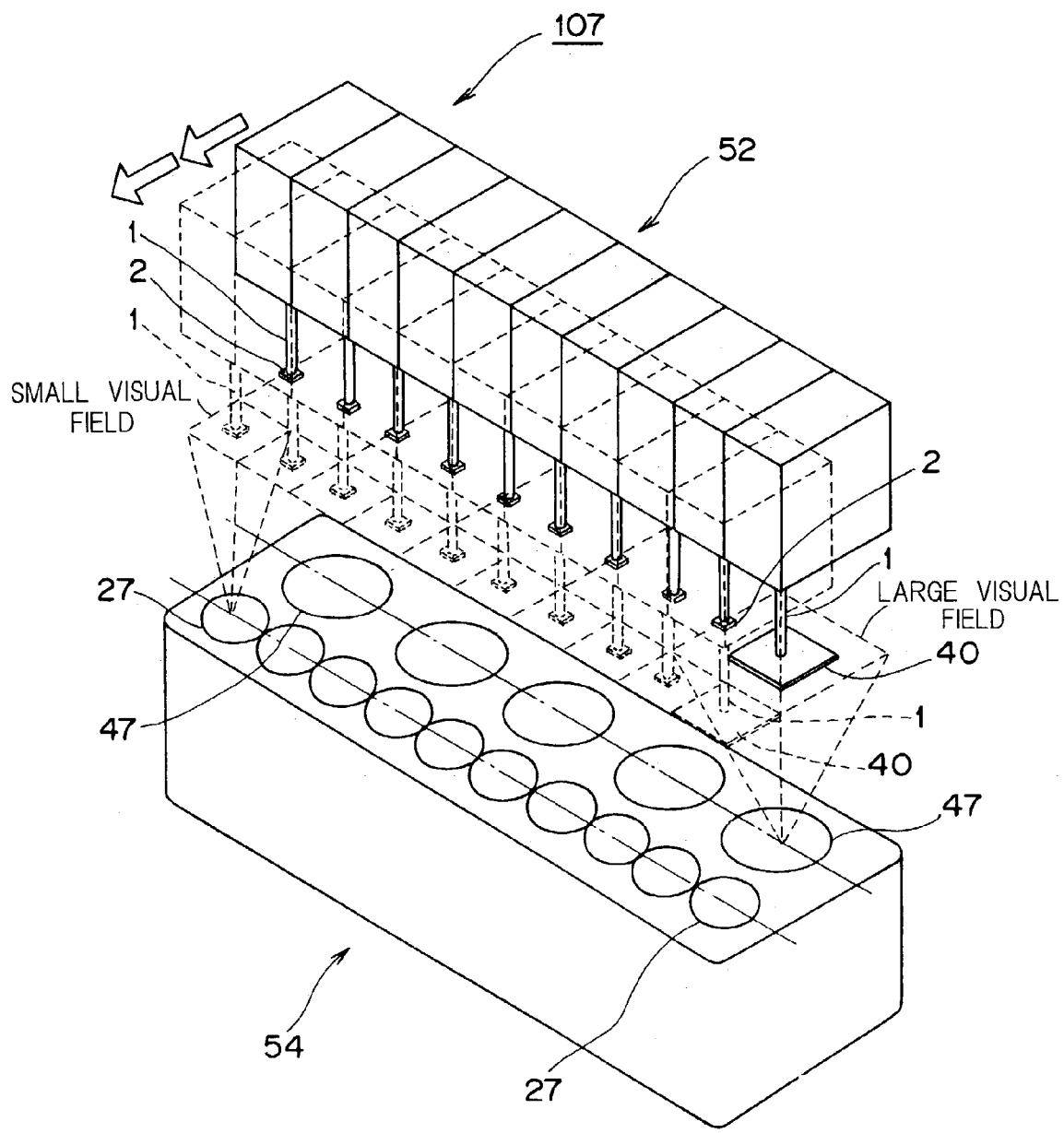
FIG. 16 is a schematic constituent view showing another example of the head unit and the image pickup device according to the fourth embodiment.

Furthermore, in a case where a multiplicity of electronic components 40 are sucked and held by the suction nozzles 1, the image pickup device 44 may include a plurality of large visual field lenses 47. As a working example in such a case, FIG. 16 is a schematic constituent view showing a head 52 of a head unit 107 and an image pickup device 54 in which a number of the lenses 47 to be installed and arrangement positions in the image pickup device 44 of the head unit 106 are changed. The head 52 is the same as the head 42, and the image pickup device 54 is equipped with five lenses 47 adjacent each other and parallel to lenses 27 separately from the lenses 27. A method for picking up images of electronic components 2 and electronic components 40 in the head unit 107 is the same as in the case of the head unit 106.

According to the fourth embodiment, even in a case where electronic components 40 such as QFP, larger than electronic component 2 such as a chip component, are included among electronic components sucked and held by the suction nozzles 1 of the head 42 and the head 52, since the image pickup device 44 and the image pickup device 54 include lenses 47 with a large visual field and high resolution having a larger visual field and a higher resolution than those of the lenses 27 separately from the lenses 27, images of the electronic components 40 can be picked up, and the same effects as the effects by the second embodiment can be obtained. Thus, the electronic component mounting apparatus can be provided in which more kinds of electronic components can be mounted.

By appropriately combining arbitrary embodiments among the various embodiments, effects of respective embodiments can be performed.

According to the first aspect of the present invention, after images of sucked and held states of all sucked and held electronic components are picked up, the sucked and held states are recognized following an order of placing the electronic components onto a circuit board. Consequently, when recognition processing of the sucked and held state of an electronic component to be placed first is completed, the electronic component to be placed first can be placed onto the circuit board, and, subsequently, recognition processing of sucked and held states of electronic components to be placed second and thereafter is successively performed in the aforementioned order. Each time the recognition processing is completed, each of the electronic components to be placed second and after can be placed onto the circuit board. Consequently, thereafter the images of sucked and held states of electronic components are picked up, the electronic components are successively placed in the order of placing them onto the circuit board during a process of the recognition processing of the images of the sucked and held states. Therefore, even when the recognition processing of images of sucked and held states of all the electronic components is not completed, operations of placing the electronic components can be performed at the same time as recognition processing work, and thus a mounting method can be realized by which time required to mount electronic components can be reduced.

According to the second aspect of the present invention, since images of sucked and held states of electronic components are simultaneously picked up, the same effects as the effects by the first aspect can be obtained. In addition, time required to pick up images can be reduced, and thus a mounting method can be provided by which time for mounting the electronic components is reduced.

According to the third aspect of the present invention, the same effects as the effects of the first aspect can be obtained. In addition, in a case where a plurality of sucked and held electronic components include two kinds of electronic components, that is, first electronic components and second electronic components, image pickup can be performed for each kind of electronic component while matching characteristics of the electronic components by separately picking up images of the first electronic components and the second electronic component. Therefore, an electronic component mounting method can be provided by which more kinds of electronic components can be mounted.

According to the fourth aspect of the present invention, in addition to the effects obtained by the third aspect, since images of either the first electronic components or the second electronic components are simultaneously picked up, time required for this image pickup can be reduced, and a mounting method can be provided by which time for mounting electronic components is reduced.

According to the fifth aspect of the present invention, even when there are a large number of electronic components, and operations of placing the electronic components are started before recognition processing of all the electronic components is completed, the recognition processing is performed in an order of placing the electronic components onto a circuit board. Therefore, for example, while an operation of placing an electronic component to be placed first is being performed, the recognition processing of an electronic component to be placed second is performed, and thus a placing operation and the recognition processing can be performed simultaneously. Thus, without wait time for a start of placement, the operation of placing the electronic component can be started. Therefore, even when the recognition processing of images of sucked and held states of all the electronic components is not completed, operations of placing electronic components can be started at the same time as recognition processing work, and thus a mounting method can be realized by which time required to mount electronic components is efficiently reduced.

According to the sixth aspect of the present invention, since images of all sucked and held electronic components are picked up by an image pickup device during a process of moving the sucked and held electronic components for placing them onto a circuit board, the same effects as effects of the first aspect to the fifth aspect can be obtained.

According to the seventh aspect of the present invention, sucked and held electronic components are moved through positions at which all images of the electronic components can be picked up by an image pickup device during a process of moving the sucked and held electronic components for placing them onto a circuit board, and, when the positions are passed, all the images of the sucked and held electronic components are picked up. Consequently, the same effects as the effects of the first to fifth aspects can be obtained.

According to the eighth or ninth aspect of the present invention, first, since a component holding unit includes a plurality of sucking and holding members and the image pickup device, sucked and held states of electronic components sucked and held by the plurality of sucking and holding members can be picked up by the image pickup device during a process of moving the component holding unit from sucking and holding of the electronic components to mounting of them onto a circuit board. That is, since image pickup can be performed without restricting a traveling path of the component holding unit due to image pickup performed by the image pickup device, an image pickup operation that does not affect a moving operation of the component holding unit can be performed.

Furthermore, after all the images of the electronic components are picked up by the image pickup device, the sucked and held states are recognized in the control unit in an order of placing the electronic components onto the circuit board. When recognition processing of the sucked and held state of an electronic component to be placed first is completed, the electronic component to be placed first can be placed onto the circuit board, and recognition processing of sucked and held states of electronic components to placed second and thereafter is successively performed in the aforementioned order. Each time recognition processing is completed, the electronic components to be placed second and thereafter can be placed onto the circuit board. Consequently, after the image of the sucked and held state of the electronic component is picked up, the electronic components can be successively placed in the order of being placed onto the circuit board during a process of the recognition processing of the sucked and held states of the images. Therefore, even when the recognition processing of the images of the sucked and held states of all the electronic components is not completed, operations of placing electronic components can be performed at the same time as recognition processing work, and thus an electronic component mounting apparatus can be provided in which time required to mount electronic components is efficiently reduced.

According to the tenth or eleventh aspect of the present invention, even when the component holding unit including a plurality of sucking and holding members does not include an image pickup device and the image pickup device is disposed separately, in a process of moving the component holding unit by a moving device from an electronic component feeding unit to an electronic component placement unit, the component holding unit is moved through positions at which images of the electronic components can be picked up by the image pickup device, and, when the positions are passed, all the images of the electronic components sucked and held by the plurality of the sucking and holding members are picked up by the image pickup device. Consequently, the same effects as the effects of the eighth or ninth aspect can be obtained.

According to the twelfth or thirteenth aspect of the present invention, since the image pickup device includes the same number of image pickup elements as the number of sucking and holding members, image pickup of a plurality of electronic components by the image pickup device can be performed by simultaneously picking up images of the plurality of electronic components by image pickup elements, and the same effects as effects of the eighth or ninth aspect can be obtained. In addition, time required for image pickup can be reduced, and thus an electronic component mounting apparatus can be provided in which time for mounting electronic components is reduced.

According to the fourteenth or fifteenth aspect of the present invention, since the image pickup device includes the same number of image pickup elements as the number of sucking and holding members, image pickup of a plurality of electronic components by the image pickup device can be performed by simultaneously picking up images of the plurality of electronic components by the image pickup elements, and the same effects as the effects of the tenth or eleventh aspect can be obtained. In addition, time required for image pickup can be reduced, and thus an electronic component mounting apparatus can be provided in which time for mounting electronic components is reduced.

According to the sixteenth aspect of the present invention, a sucking and holding member is included in the component holding unit so that it can be replaced with a different kind of sucking and holding member. Furthermore, a lens for forming images of electronic components to be picked up by an image pickup element is included in an image pickup device so that a lens can be replaced with a different kind of lens. Thus, an electronic component mounting apparatus can be provided in which many kinds of electronic components can be mounted.

According to the seventeenth or eighteenth aspect of the present invention, the same effects as the effects of the tenth or eleventh aspect can be obtained. In addition, when a plurality of electronic components to be mounted onto a circuit board includes two kinds of electronic components, that is, first electronic components and second electronic components, since the image pickup device includes lenses for forming images of the first electronic components that can be picked up and lenses for forming images of the second electronic components that can be picked up, the images can be formed by the lenses corresponding to the first electronic components and the second electronic components and picked up separately. Therefore, image pickup can be performed by the lenses matching characteristics of the electronic components depending on the kinds of the electronic components, and an electronic component mounting apparatus can be provided in which more kinds of electronic components can be mounted.

According to the nineteenth aspect of the present invention, in addition to the effects obtained by the seventeenth or eighteenth aspect, since images of at least either the first electronic components or the second electronic components are simultaneously picked up, time required for image pickup can be reduced, and thus a mounting method can be provided by which time for mounting electronic components is reduced.

According to the twentieth aspect of the present invention, even when there are a large number of electronic components sucked and held by sucking and holding members and a component holding unit reaches an electronic component placement unit and an operation of placing an electronic component is started before recognition processing of all the electronic components is completed, the recognition processing is performed in an order of placing the electronic components onto a circuit board. Therefore, for example, a placing operation and recognition processing can be simultaneously performed so that the recognition processing of an electronic component to be placed second is performed while an operation of placing an electronic component to be placed first is being performed. Thus, without a wait time for start of placement, operations of placing the electronic components can be started. Therefore, even when the recognition processing of images of sucked and held states of all the electronic components is not completed, operations of placing electronic components can be started at the same time as recognition processing work, and thus a mounting method can be realized by which time required to mount electronic components is efficiently reduced.

According to the twenty-first aspect of the present invention, since the sucking and holding members are arranged in a matrix with a plurality of rows and a plurality of columns in the component holding unit, and image pickup elements are arranged so as to correspond to the sucking and holding members one to one in the image pickup device, a size of a component holding unit in a row direction can be reduced in comparison with a component holding unit in which sucking and holding members arranged in one row and a plurality of columns. Since a component holding unit equipped with a multiplicity of sucking and holding members is mounted on one electronic component mounting apparatus, a multiplicity of electronic components can be placed onto a circuit board by one sucking and holding processing of electronic components by the sucking and holding members. Conse-quently, an electronic component mounting apparatus can be provided in which mounting time per one circuit board can be further reduced.

Along with the above, by making the electronic component holding device smaller, a small-size electronic component mounting apparatus can be realized, area productivity can be improved, and an entire production line for mounting electronic components onto a circuit board can be reduced in size.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. An electronic component mounting method comprising:
   performing a single image picking-up operation by which images of all electronic components sucked and held by sucking and holding members, respectively, are picked up by image pickup devices corresponding respectively to said sucking and holding members;
   successively recognition-processing sucked and held states of said electronic components, by using said images of said electronic components as picked up by said image pickup devices, in an order in which said electronic components are to be placed onto a circuit board; and
   while successively recognition-processing said sucked and held states of said electronic components, successively setting said electronic components, for which the recognition-processing has been completed, so as to be placeable onto said circuit board.

2. The method according to claim 1, further comprising:
   while successively recognition-processing said sucked and held states of said electronic components, and after successively setting said electronic components for which the recognition-processing has been completed, and based on results of the recognition-processing, successively starting placement onto said circuit board of said electronic components that have been set so as to be placeable onto said circuit board.

3. The method according to claim 2, wherein
   performing said single image picking-up operation comprises performing said single image picking-up operation during a process of moving said electronic components, while sucked and held by said sucking and holding members, for placement onto said circuit board.

4. The method according to claim 2, wherein
   performing said single image picking-up operation comprises performing said single image picking-up operation upon passage of said electronic components through a position to which said electronic components have been routed during a process of moving said electronic components, while sucked and held by said sucking and holding members, for placement onto said circuit board.

5. The method according to claim 1, wherein
   performing said single image picking-up operation comprises performing said single image picking-up operation during a process of moving said electronic components, while sucked and held by said sucking and holding members, for placement onto said circuit board.

6. The method according to claim 1, wherein
performing said single image picking-up operation comprises performing said single image picking-up operation upon passage of said electronic components through a position to which said electronic components have been routed during a process of moving said electronic components, while sucked and held by said sucking and holding members, for placement onto said circuit board.

7. An electronic component mounting method comprising:
using different optical systems to simultaneously pick up images of sucked and held electronic components;
successively recognition-processing sucked and held states of said sucked and held electronic components, by using said images of said sucked and held electronic components as picked up by said different optical systems, in an order in which said sucked and held electronic components are to be placed onto a circuit board; and
while successively recognition-processing said sucked and held states of said sucked and held electronic components, successively setting said sucked and held electronic components, for which the recognition-processing has been completed, so as to be placeable onto said circuit board.

8. The method according to claim 7, further comprising:
while successively recognition-processing said sucked and held states of said sucked and held electronic components and after successively setting said sucked and held electronic components for which the recognition-processing has been completed, and based on results of the recognition-processing, successively starting placement onto said circuit board of said sucked and held electronic components that have been set so as to be placeable onto said circuit board.

9. The method according to claim 8, wherein
using different optical systems to simultaneously pick up images of sucked and held electronic components comprises using said different optical systems to pick up said images during a process of moving said sucked and held components for placement onto said circuit board.

10. The method according to claim 8, wherein
using different optical systems to simultaneously pick up images of sucked and held electronic components comprises using said different optical systems to pick up said images of said sucked and held components upon passage of said sucked and held electronic components through a position to which said sucked and held electronic components have been routed during a process of moving said sucked and held electronic components for placement onto said circuit board.

11. The method according to claim 7, wherein
using different optical systems to simultaneously pick up images of sucked and held electronic components comprises using said different optical systems to pick up said images during a process of moving said sucked and held components for placement onto said circuit board.

12. The method according to claim 7, wherein
using different optical systems to simultaneously pick up images of sucked and held electronic components comprises using said different optical systems to pick up said images of said sucked and held components upon passage of said sucked and held electronic components through a position to which said sucked and held electronic components have been routed during a process of moving said sucked and held electronic components for placement onto said circuit board.

13. An electronic component mounting method comprising:
using first optical systems to simultaneously pick up images of sucked and held electronic components of a first kind; then
using second optical systems, different from said first optical systems, to pick up images of sucked and held electronic components of a second kind;
successively recognition-processing sucked and held states of said sucked and held electronic components of the first and second kinds, by using said images of said sucked and held electronic components of the first and second kinds as picked up by said first and second optical systems, in an order in which said sucked and held electronic components of the first and second kinds are to be placed onto a circuit board; and
while successively recognition-processing said sucked and held states of said sucked and held electronic components of the first and second kinds, successively setting said sucked and held electronic components of the first and second kinds, for which the recognition-processing has been completed, so as to be placeable onto said circuit board.

14. The method according to claim 13, further comprising:
while successively recognition-processing said sucked and held states of said sucked and held electronic components of the first and second kinds and after successively setting said sucked and held electronic components of the first and second kinds for which the recognition-processing has been completed, and based on results of the recognition-processing, successively starting placement onto said circuit board of said sucked and held electronic components of the first and second kinds that have been set so as to be placeable onto said circuit board.

15. The method according to claim 14, wherein
using said first and second optical systems to pick up said images of sucked and held electronic components of the first and second kinds comprises using said first and second optical systems to pick up said images during a process of moving said sucked and held components of the first and second kinds for placement onto said circuit board.

16. The method according to claim 14, wherein
using said first and second optical systems to pick up said images of sucked and held electronic components of the first and second kinds comprises using said first and second optical systems to pick up said images of said sucked and held components of the first and second kinds upon passage of said sucked and held electronic components of the first and second kinds through a position to which said sucked and held electronic components of the first and second kinds have been routed during a process of moving said sucked and held electronic components of the first and second kinds for placement onto said circuit board.

17. The method according to claim 13, wherein
using said first and second optical systems to pick up said images of sucked and held electronic components of the first and second kinds comprises using said first and second optical systems to pick up said images during a process of moving said sucked and held components of the first and second kinds for placement onto said circuit board.

18. The method according to claim 13, wherein using said first and second optical systems to pick up said images of said sucked and held electronic components of the first and second kinds comprises using said first and second optical systems to pick up said images of said sucked and held components of the first and second kinds upon passage of said sucked and held electronic components of the first and second kinds through a position to which said sucked and held electronic components of the first and second kinds have been routed during a process of moving said sucked and held electronic components of the first and second kinds for placement onto said circuit board.

* * * * *